(12) United States Patent
Mochizuki

(10) Patent No.: US 12,671,370 B2
(45) Date of Patent: Jun. 30, 2026

(54) WIRELESS COMMUNICATION APPARATUS AND WIRELESS COMMUNICATION METHOD

(71) Applicant: NEC Corporation, Tokyo (JP)

(72) Inventor: Takuji Mochizuki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 18/844,094

(22) PCT Filed: Mar. 30, 2022

(86) PCT No.: PCT/JP2022/016155
§ 371 (c)(1),
(2) Date: Sep. 5, 2024

(87) PCT Pub. No.: WO2023/188161
PCT Pub. Date: Oct. 5, 2023

(65) Prior Publication Data
US 2025/0192735 A1 Jun. 12, 2025

(51) Int. Cl.
*H03F 3/19* (2006.01)
*H04B 1/04* (2006.01)
*H04L 5/14* (2006.01)

(52) U.S. Cl.
CPC .............. *H03F 3/19* (2013.01); *H04B 1/04* (2013.01); *H03F 2200/451* (2013.01); *H04B 2001/0416* (2013.01); *H04L 5/14* (2013.01)

(58) Field of Classification Search
CPC ...... H03F 3/19; H03F 2200/451; H03F 3/193; H03F 3/2171; H03F 3/245; H03F 3/505; H04B 1/04; H04B 2001/0416; H04L 5/14
See application file for complete search history.

(56) References Cited

U.S. PATENT DOCUMENTS

2020/0195201 A1* 6/2020 Srinidhi Embar ...... H03F 1/565
2021/0242841 A1* 8/2021 Hayashi .................... H03F 1/02
(Continued)

FOREIGN PATENT DOCUMENTS

JP H02-116769 A 5/1990
JP 2012-227795 A 11/2012
(Continued)

OTHER PUBLICATIONS

Extended European Search Report for EP Application No. 22935306.5, dated on Apr. 24, 2025.
(Continued)

*Primary Examiner* — David S Huang
(74) *Attorney, Agent, or Firm* — Sughrue Mion, PLLC

(57) ABSTRACT

An AAS (10) according to the present disclosure includes a signal processing unit (11), a transmitter (12) provided at a stage following the signal processing unit (11), and a transmission amplifier (13) provided at a stage following the transmitter (12). The signal processing unit (11) detects whether there is a transmission signal, and inserts a stabilization signal for stabilizing characteristics of the transmission amplifier (13) in a time domain preceding a time domain of the transmission signal when the transmission signal is detected, so that the stabilization signal passes through the transmitter (12) and the transmission amplifier (13) before the transmission signal passes through the transmitter (12) and the transmission amplifier (13).

9 Claims, 28 Drawing Sheets

(56) References Cited

U.S. PATENT DOCUMENTS

| | | | |
|---|---|---|---|
| 2022/0021404 A1 | | 1/2022 | Horita et al. |
| 2024/0146503 A1* | | 5/2024 | Beikmirza .............. H04B 1/04 |

FOREIGN PATENT DOCUMENTS

| | | |
|---|---|---|
| JP | 2021-121054 A | 8/2021 |
| JP | 2022-018955 A | 1/2022 |
| WO | 2012/111274 A1 | 8/2012 |

OTHER PUBLICATIONS

Cappello Tommaso et al: "Linearization of a 500-W L-band GaN Doherty Power Amplifier by Dual-Pulse Trap Characterization", 2019 IEEE MTT-S International Microwave Symposium (IMS), IEEE, Jun. 2, 2019.

Barradas Filipe M et al: "Compensation of Power Amplifier Long-Term Memory Behavior for Pulsed Radar Applications", IEEE Transactions on Microwave Theory and Techniques, IEEE, USA, vol. 67, No. 12, Dec. 1, 2019.

Florian Corrado et al: "Pre-Pulsing Characterization of GaN PAs with Dynamic Supply", 2016 IEEE MTT-S International Microwave Symposium (IMS), IEEE, May 22, 2016.

International Search Report for PCT Application No. PCT/JP2022/016155, mailed on Jul. 5, 2022.

3rd Generation Partnership Project; Technical Specification Group Radio Access Network; NR; Base Station (BS) radio transmission and reception (Release 15), 3GPP TS 38.104 V15.16.0 (Dec. 2021).

3rd Generation Partnership Project;Technical Specification Group Radio Access Network; NR; Base Station (BS) conformance testing Part 1: Conducted conformance testing (Release 15), 3GPP TS 38.141-1 V15. 11.0 (Dec. 2021).

JP Office Action for JP Application No. 2024-510934, mailed on Oct. 21, 2025 with English Translation.

* cited by examiner

WHEN Gate IS TURNED ON FROM SHALLOW Vgs,
TIME TAKEN TO REACH DESIRED Ids AFTER Gate
IS TURNED ON TENDS TO BE SHORTENED EVM OF HEAD Symbol OF DL SIGNAL DETERIORATES EVM OF HEAD Symbol OF DL SIGNAL DOES NOT DETERIORATE AMP HAVING POOR Gate/Drain Lag symbol1

PHASE ROTATION OCCURS

AMP HAVING GOOD Gate/Drain Lag symbol1

CONSTELLATION IS NORMAL

AMP HAVING GOOD Gate/Drain Lag

Fig. 14

NO RF MODULATION SIGNAL IS INPUT TO AMP

WHEN Subcarrier Spacing IS 30 kHz
: ABOUT 36 μ sec

ABOUT 80 μ sec IS REQUIRED TO RECOVER Ids

HIGHER INPUT LEVEL OF RF MODULATION SIGNAL TO AMP SHORTEN TIME TAKEN
FOR RECOVERING Ids FROM CURRENT COLLAPSE

EXAMPLE OF GENERATION OF AMP STABILIZATION SIGNAL (TIME SIGNAL)

AMP STABILIZATION SIGNAL IS APPLIED

AMP STABILIZATION SIGNAL          DL SIGNAL

AMP STABILIZATION SIGNAL IS APPLIED TO
AMP HAVING POOR Gate/Drain Lag symbol1

CONSTELLATION IS NORMAL

WIRELESS COMMUNICATION APPARATUS AND WIRELESS COMMUNICATION METHOD

This application is a National Stage Entry of PCT/JP2022/016155 filed on Mar. 30, 2022, the contents of all of which are incorporated herein by reference, in their entirety.

TECHNICAL FIELD

The present disclosure relates to a wireless communication apparatus and a wireless communication method.

BACKGROUND ART

Compared with GaAs, GaN is advantageous in that it has large band gap energy, can be fine-tuned with high pressure resistance, and has high electron mobility. For this reason, a radio frequency (RF) device such as a transmission AMP using a GaN field effect transistor (FET) has been continuously adopted as a high-output RF device exceeding an RF device using a GaAs FET in a wireless communication apparatus such as a wide area base station, a macro base station, or an antenna active system (AAS). In addition, the two-dimensional electron gas structure of the GaN/AlGaN FET has physical characteristics such as high mobility as compared with that of a Si FET. For this reason, an RF device using a GaN/AlGaN FET has been particularly adopted and put into practical use as a high-output RF device in a high-frequency RF band. Examples of GaN/AlGaN FETs include GaN/AlGaN high electron mobility transistors (HEMTs).

FIG. 1 is a diagram illustrating an example of a structure of a GaN/AlGaN HEMT. FIG. 2 is a diagram illustrating an example of a band structure of a GaN/AlGaN HEMT. As illustrated in FIGS. 1 and 2, the GaN/AlGaN HEMT is realized by growing GaN/AlGaN on a sapphire substrate. In the GaN/AlGaN HEMT, an electron supply layer (AlGaN layer) and an electron transit layer (GaN layer) are different from each other, using an electron layer called a two-dimensional electron gas generated at a boundary between different compound materials as a carrier. Therefore, the GaN/AlGaN HEMT is advantageous in that high electron mobility can be realized, while allowing use at a high speed and at a high frequency, and enabling high-power output with high efficiency.

When the AlGaN/GaN HEMT is operated with large amplitude and large power, it is required to take measures against various parasitic phenomena. At present, concerning the AlGaN/GaN HEMT, various parasitic phenomena caused by GaN semi-insulating substrates, surface levels, and deep impurity levels present at substrate interfaces are known. These parasitic phenomena are problematic in the RF device using the AlGaN/GaN HEMT in terms of output power, distortion characteristics, stability, and reliability. Concerning a surface level of a semiconductor, an energy level is determined inside the crystal of the semiconductor. However, if continuity is interrupted on the surface of the semiconductor, an energy level (=surface level) different from that inside the crystal exists. This surface level is formed by rearrangement on the crystal surface, adsorption of external atoms such as oxygen atoms and hydrogen atoms, or the like, making theoretical analysis very complicated. Therefore, it is quite difficult to overcome the parasitic phenomenon caused by the surface level.

Among these parasitic phenomena, a phenomenon called a current collapse is a phenomenon in which a drain current decreases as a drain voltage is applied. The current collapse is described in, for example, Patent Literature 1. When the operation class of the transmission AMP is changed from class A to class AB to class C, etc. to aim for higher efficiency and higher power of the transmission AMP, a drain current is further increased or decreased according to an amplitude of a transmission signal. The increase or decrease in drain current becomes an unstable factor (memory effect) such as a decrease and fluctuation in current gain and output depending on the history of temporally past amplitude amplification operations, making it more difficult to improve distortion using digital pre-distortion (DPD).

Furthermore, in the transmission AMP, transient phenomena such as drain lag and gate lag are also problems. In a transmission AMP of class C or higher, class C amplification is started by a flow of a drain current according to a certain amplitude or higher of a transmission signal, and a basic amplification signal is output by a matching circuit that matches the output of the transmission AMP (a tank circuit that extracts and outputs only a basic wave from a harmonic group amplified signal containing an amplification signal as the basic wave). The drain lag is a phenomenon in which, when the drain voltage is rapidly changed from Off to On to enable the amplification operation of the transmission AMP, the drain current changes transiently and slowly until a steady voltage state is reached. In addition, a wireless communication apparatus equipped with the transmission AMP turns off/on the transmission AMP in accordance with a switch to an up link (UL)/down link (DL) operation in time division duplex (TDD). When the transmission AMP is turned off/on, a desired Ids is set by performing a control for switching a Vgs from a pinch-off state (a deep Vgs set to satisfy Ids=0A) to a shallow Vgs voltage so as to obtain an Ids setting value for obtaining the desired AMP performance, leading to a transmission AMP-On operation. At this time, a rapid change in gate voltage occurs. The gate lag is a phenomenon in which the drain current changes transiently and slowly until a steady voltage state is reached, with respect to the rapid change in gate voltage (the rapid change from the state where the transmission AMP is completely turned off by Ids Off with Gate Pinch-Off to the gate voltage at which Ids for turning on the transmission AMP is set). The gate lag and the drain lag (hereinafter, appropriately referred to as "gate/drain lag") also cause a failure, a delay in transient response, until the normal state is reached when a transmission AMP using an AlGaN/GaN HEMT performs a high-speed off/on operation and a burst operation in order to perform a TDD operation. The normal state means that nonlinear distortion characteristics such as gain, output, and AM (amplitude modulation)-AM/AM-PM (phase modulation) are in a steady state. Here, in a situation under the TDD system, a long term evolution (LTE) or fifth generation partnership project (5G) base station performs an adaptive control to reduce power consumption by a burst operation for turning on/off the transmission AMP in time or an operation for frequently turning on/off the transmission AMP according to a transmission symbol. In this case, because of the above-mentioned delay in transient response, it is necessary to significantly advance the turn-on control of the transmission AMP, and therefore it takes a lot of time to stabilize the transmission signal.

In a case where a transient phenomenon such as the above-mentioned gate/drain lag occurs in the transmission AMP, charging and discharging have a certain time constant due to a charged state of an AMP substrate (a substrate portion of a bare chip die inside the AMP) at a deep level or a surface level. For this reason, before a transmission signal is input to the transmission AMP, the time taken for the drain current to reach the target steady drain current is greatly delayed because the transmission AMP is turned off/on. As a result, when the transmission signal passes through the transmission AMP, the gain, the output, and the nonlinear distortion characteristics of the head portion of the transmission signal do not reach a steady state. This leads to a failure in securing stable characteristics of the transmission AMP every time the transmission AMP is turned on for the above-described adaptive control to reduce power consumption.

Accordingly, in a case where the LTE or 5G base station adopts a transmission AMP using a GaN FET, it is difficult to perform the above-described adaptive control to reduce power consumption and the like in a situation under the TDD system, causing many defects in the system characteristics of the TDD system.

CITATION LIST

Patent Literature

Patent Literature 1: Japanese Unexamined Patent Application Publication No. 2012-227795

SUMMARY OF INVENTION

Technical Problem

Hereinafter, the above-described problem will be described with reference to the drawings. Hereinafter, an AMP using a GaN FET will be appropriately referred to as a "GaN AMP". In addition, in the following description, it is assumed that a wireless communication apparatus equipped with a transmission AMP is an AAS that transmits a DL signal as a transmission signal to each user equipment (UE).

FIG. 3 is a diagram illustrating an example of a characteristic of a drain current Ids when a gate is turned on from a pinch-off state in the transmission AMP that is a GaN AMP. In FIG. 3, the horizontal axis represents a time, and the vertical axis represents a drain current Ids. FIG. 4 is an enlarged view of a portion X of FIG. 3. FIG. 4 illustrates characteristics of Ids when the setting of Vgs is changed in four ways.

As illustrated in FIG. 3, since the gate voltage rapidly increases by turning on the gate from the pinch-off state, the drain current Ids changes transiently and slowly until reaching the desired Ids, causing a gate lag. In addition, as illustrated in FIG. 4, when the gate is turned on with Vgs set shallower than Vgs in the pinch-off state, which is deep, the time taken for the drain current Ids to reach the desired Ids after the gate is turned on tends to be shortened.

FIG. 5 is a diagram illustrating an example of how the characteristic of the drain current Ids when an impulse is input to the transmission AMP that is a GaN AMP having a poor drain lag deteriorates from the state value of Ids set in the steady state before the impulse is applied. Furthermore, FIG. 6 is a diagram illustrating an example of a characteristic of the drain current Ids when an impulse is input to the transmission AMP that is a GaN AMP having a good drain lag. In FIGS. 5 and 6, the horizontal axis represents a time, and the vertical axis represents a drain current Ids.

As illustrated in FIG. 5, when an impulse is input to a transmission AMP having a poor drain lag, the drain current Ids decreases by about 90% immediately after the input.

Therefore, it takes a long period of time to recover the drain current Ids to the desired Ids.

In LTE, when the subcarrier spacing is 15 kHz, the 1-symbol length is about 64 usec. In addition, in 5G, when the subcarrier spacing is 30 kHz, the 1-symbol length is about 36 usec, which is about ½ of the 1-symbol length in LTE described above.

Therefore, in a case where the transmission AMP has a poor drain lag, it is difficult to recover the drain current Ids to the desired Ids within the 1-symbol length after the impulse is input in either LTE or 5G.

On the other hand, as illustrated in FIG. 6, when an impulse is input to the transmission AMP having a good drain lag, the decrease in drain current Ids immediately after the input is merely about 40%. Therefore, the drain current Ids can be recovered to the desired Ids in a short period of time.

Therefore, in a case where the transmission AMP has a good drain lag, the drain current Ids can be recovered to the desired Ids within the 1-symbol length after the impulse is input in either LTE or 5G.

FIG. 7 is a diagram illustrating an example of a characteristic of the drain current Ids when each of the transmission AMP that is a GaN AMP having a good gate/drain lag and the transmission AMP that is a GaN AMP having a poor gate/drain lag is turned on. In FIG. 7, the horizontal axis represents a time, and the vertical axis represents a drain current Ids. FIG. 8 is an enlarged view of a portion X of FIG. 7. Note that, in FIGS. 7 and 8, no RF modulation signal is input to the transmission AMP.

As illustrated in FIGS. 7 and 8, in a case where the transmission AMP has a good gate/drain lag, the rising characteristic of the drain current Ids immediately after the transmission AMP is turned on is good. Therefore, the drain current Ids can be recovered to the desired Ids in a short period of time. On the other hand, in a case where the transmission AMP has a poor gate/drain lag, the drain current Ids gradually rises immediately after the transmission AMP is turned on. Therefore, it takes a long period of time to recover the drain current Ids to the desired Ids.

FIG. 9 is a diagram illustrating an example of a characteristic of an error vector magnitude (EVM) when a transmission AMP is turned on in an AAS equipped with the transmission AMP that is a GaN AMP having a poor gate/drain lag. Furthermore, FIG. 10 is a diagram illustrating an example of a characteristic of an EVM when a transmission AMP is turned on in an AAS equipped with the transmission AMP that is a GaN AMP having a good gate/drain lag. In FIGS. 9 and 10, the horizontal axis represents a symbol, and the vertical axis represents an EVM. Note that in FIGS. 9 and 10, the transmission AMP is repeatedly turned on/off twice.

As illustrated in FIG. 9, in a case where the AAS is equipped with a transmission AMP having a poor gate/drain lag, in a DL signal immediately after the transmission AMP is turned on, an EVM of a head symbol 1 deteriorates because an overshoot occurs. On the other hand, as illustrated in FIG. 10, in a case where the AAS is equipped with a transmission AMP having a good gate/drain lag, in a DL signal immediately after the transmission AMP is turned on, an EVM does not deteriorate because an overshoot is suppressed from a head symbol 1.

FIG. 11 is a diagram illustrating an example of a constellation of a head symbol 1 in a DL signal immediately after a transmission AMP is turned on in an AAS equipped with the transmission AMP that is a GaN AMP having a poor gate/drain lag. In addition, FIG. 12 is a diagram illustrating an example of a constellation of a head symbol 1 in a DL signal immediately after a transmission AMP is turned on in an AAS equipped with the transmission AMP that is a GaN AMP having a good gate/drain lag.

As illustrated in FIG. 11, in a case where the AAS is equipped with a transmission AMP having a poor gate/drain lag, a phase rotation occurs in the constellation of the head symbol 1 in the DL signal immediately after the transmission AMP is turned on. Although not illustrated, it has been confirmed that constellations of symbols after the symbol 1 are normal. On the other hand, as illustrated in FIG. 12, in a case where the AAS is equipped with a transmission AMP having a good gate/drain lag, a constellation is normal from a head symbol 1 in a DL signal immediately after the transmission AMP is turned on.

FIG. 13 is a diagram illustrating an example of a relationship between a signal-to-noise ratio (SNR) and a throughput, for each of a plurality of modulation and channel coding schemes (MCSs) in an AAS equipped with a transmission AMP that is a GaN AMP having a poor gate/drain lag. Furthermore, FIG. 14 is a diagram illustrating an example of a relationship between an SNR and a throughput, for each of a plurality of MCSs, in an AAS equipped with a transmission AMP that is a GaN AMP with a good gate/drain lag. In FIGS. 13 and 14, the horizontal axis represents an SNR, and the vertical axis represents a throughput.

As described above, in the AAS equipped with the transmission AMP that is a GaN AMP, when a gate/drain lag occurs, an overshoot occurs in an EVM of a head symbol of a DL signal immediately after the transmission AMP is turned on. Therefore, when a gate/drain lag occurs, an overshoot occurs in an EVM of a head symbol of a DL slot for each TDD DL/UL configuration or in an EVM of a head symbol of any one of the DL slots.

Therefore, as illustrated in FIG. 13, in a case where the AAS is equipped with a transmission AMP having a poor gate/drain lag, a max throughput according to an SNR cannot be achieved particularly on a side toward the largest MCS (higher-order quadrature amplitude modulation (QAM)). Therefore, an MCS with an SNR of about 20 dB or more cannot be achieved. On the other hand, as illustrated in FIG. 14, in a case where the AAS is equipped with a transmission AMP having a good gate/drain lag, a max throughput according to an SNR can be achieved up to the maximum MCS.

As described above, in a wireless communication apparatus equipped with a transmission AMP having a poor gate/drain lag, there is a delay until the characteristics of the transmission AMP are stabilized, causing a problem that communication quality deteriorates in a head portion of a transmission signal, resulting in many defects.

In view of the aforementioned problem, an object of the present disclosure is to provide a wireless communication apparatus and a wireless communication method capable of maintaining communication quality in a head portion of a transmission signal.

Solution to Problem

A wireless communication apparatus according to an aspect includes:

a signal processing unit;
    a transmitter provided at a stage following the signal processing unit; and
    a transmission amplifier provided at a stage following the transmitter, in which the signal processing unit is configured to:
    detect whether there is a transmission signal; and
    insert a stabilization signal for stabilizing characteristics of the transmission amplifier in a time domain preceding a time domain of the transmission signal when the transmission signal is detected, so that the stabilization signal passes through the transmitter and the transmission amplifier before the transmission signal passes through the transmitter and the transmission amplifier.

A wireless communication method according to an aspect is a wireless communication method executed by a wireless communication apparatus including a transmitter and a transmission amplifier provided at a stage following the transmitter, including:
    a step of detecting whether there is a transmission signal in a stage preceding the transmission amplifier; and
    a step of inserting a stabilization signal for stabilizing characteristics of the transmission amplifier in a time domain preceding a time domain of the transmission signal when the transmission signal is detected, so that the stabilization signal passes through the transmitter and the transmission amplifier before the transmission signal passes through the transmitter and the transmission amplifier.

Advantageous Effects of Invention

According to the above aspect, it is possible to provide the wireless communication apparatus and the wireless communication method capable of maintaining communication quality in the head portion of the transmission signal.

BRIEF DESCRIPTION OF DRAWINGS

FIG. 7 is a diagram illustrating an example of a characteristic of a drain current Ids when each of a transmission AMP that is a GaN AMP having a good gate/drain lag and a transmission AMP that is a GaN AMP having a poor gate/drain lag is turned on.

Figure 14:
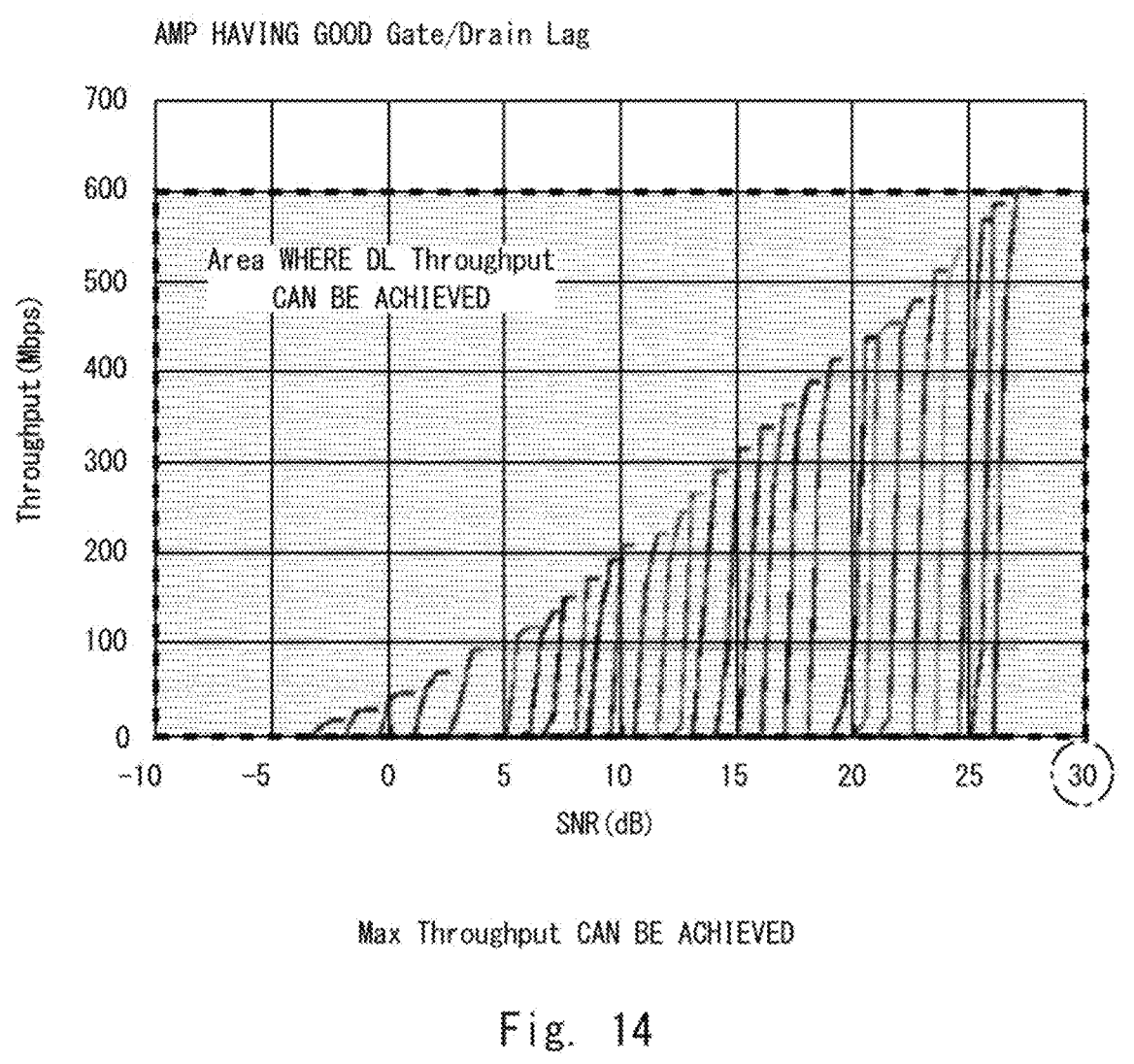

FIG. 14 is a diagram illustrating an example of a relationship between an SNR and a throughput, for each of a plurality of MCSs, in an AAS equipped with a transmission AMP that is a GaN AMP with a good gate/drain lag.

FIG. 15 is a diagram illustrating an example of a characteristic of a drain current Ids in a state where no RF modulation signal is input when each of a transmission AMP that is a GaN AMP having a good gate/drain lag and a transmission AMP that is a GaN AMP having a poor gate/drain lag is turned on.

FIG. 17 is a diagram illustrating an example of a characteristic of a deviation in drain current Ids when RF modulation signals having different input levels are input after a transmission AMP that is a GaN AMP having a poor gate/drain lag is turned on.

EXAMPLE EMBODIMENT

Example embodiments of the present disclosure will be described below with reference to the drawings. Note that the following description and drawings are omitted and simplified as appropriate for clarity of explanation. Furthermore, in the following drawings, the same elements will be denoted by the same reference signs, and redundant description will be omitted as necessary. In addition, specific numerical values and the like shown below are merely examples for facilitating understanding of the present disclosure, and the present disclosure is not limited thereto.

Principle of Example Embodiment

Before describing the present example embodiment in detail, the principle of the present example embodiment will be described. Hereinafter, it is also assumed that a wireless communication apparatus equipped with a transmission AMP is an AAS that transmits a DL signal as a transmission signal to each UE.

The inventor of the present disclosure has found that even in a transmission AMP having a poor gate/drain lag, the time taken until the characteristics of the transmission AMP are stabilized can be shortened by inputting an RF modulation signal after inputting an impulse.

Figure 15:
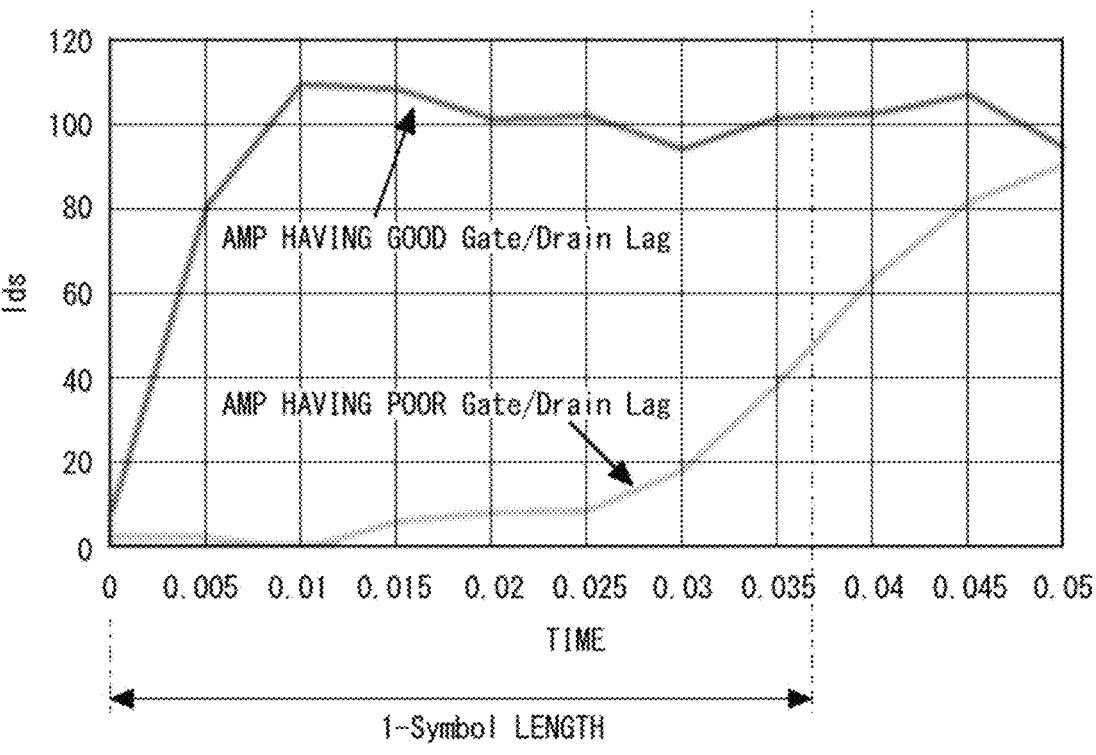
Figure 16:
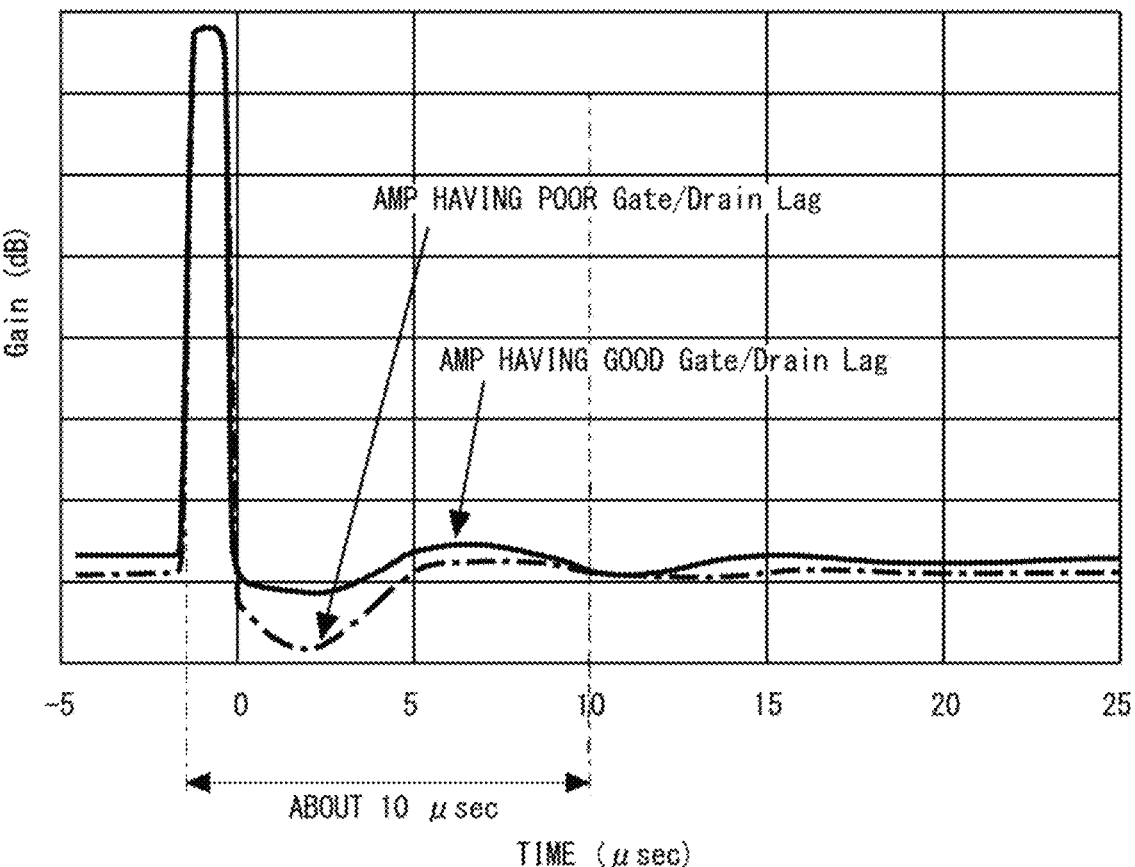
FIG. 16 is a diagram illustrating an example of a characteristic of a gain when an RF modulation signal is input together with an impulse to each of a transmission AMP that is a GaN AMP having a good gate/drain lag and a transmission AMP that is a GaN AMP having a poor gate/drain lag.

FIG. 15 is a diagram illustrating an example of a characteristic of a drain current Ids in a state where no RF modulation signal is input when each of a transmission AMP that is a GaN AMP having a good gate/drain lag and a transmission AMP that is a GaN AMP having a poor gate/drain lag is turned on. In FIG. 15, the horizontal axis represents a time, and the vertical axis represents a drain current Ids. In addition, FIG. 16 is a diagram illustrating an example of a characteristic of a gain when an RF modulation signal is input together with an impulse to each of a transmission AMP that is a GaN AMP having a good gate/drain lag and a transmission AMP that is a GaN AMP having a poor gate/drain lag. In FIG. 16, the horizontal axis represents a time and the vertical axis represents a gain.

As illustrated in FIG. 15, in a case where the transmission AMP has a poor gate/drain lag, in a state where no RF modulation signal is input, the drain current Ids gradually rises immediately after the transmission AMP is turned on. Therefore, although not illustrated in FIG. 15, it takes a long period of time of about 80 μsec to recover the drain current Ids to the desired Ids. As described above, in 5G, when the subcarrier spacing is 30 kHz, the 1-symbol length is about 36 μsec. Therefore, about 80 μsec taken until the drain current Ids is recovered corresponds to a time as much as an about 2-symbol length in 5G described above.

On the other hand, as illustrated in FIG. 16, even in a transmission AMP having a poor gate/drain lag, in a case where an RF modulation signal is input together with an impulse, the time taken until the gain is recovered to a gain before the impulse is input is about 10 μsec, and the time until the gain is recovered can be shortened. About 10 μsec taken until the gain is recovered corresponds to a time as much as an about 0.3-symbol length in 5G described above.

In addition, the inventor of the present disclosure has found that, even in a transmission AMP having a poor gate/drain lag, the higher the input level of the RF modulation signal input to the transmission AMP after the transmission AMP is turned on, the shorter the time taken until the characteristics of the transmission AMP are stabilized.

Figure 17:
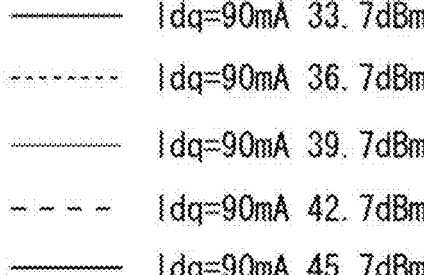
Figure 17:
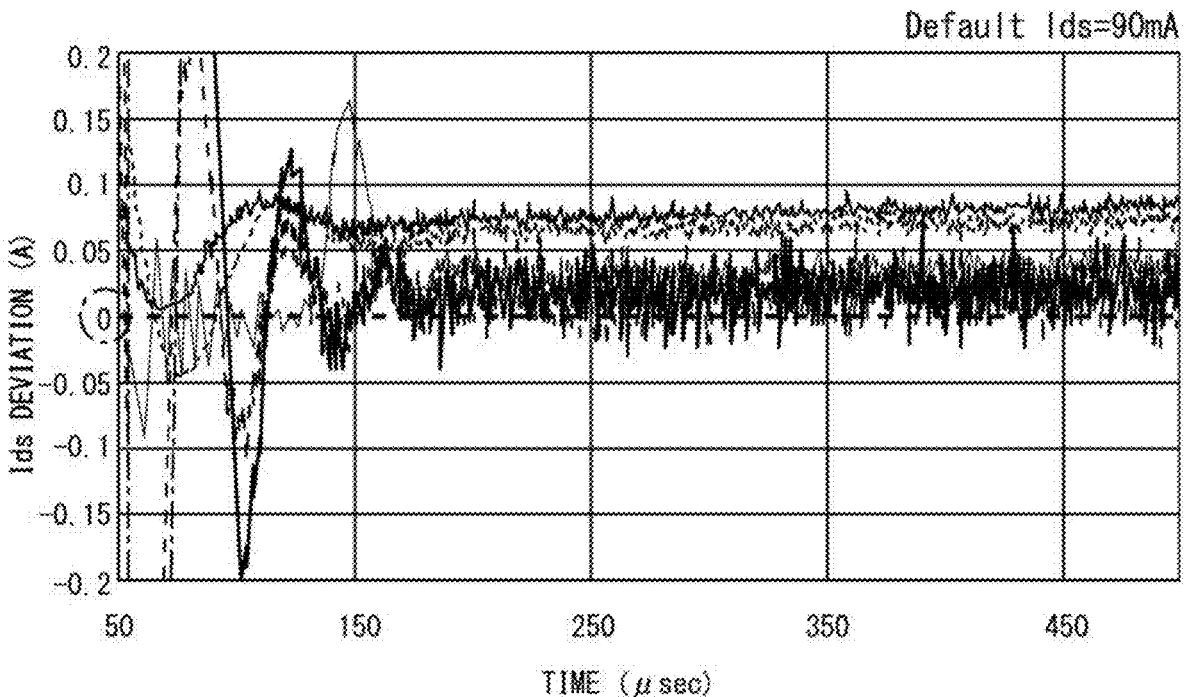

FIG. 17 is a diagram illustrating an example of a characteristic of a deviation in drain current Ids when RF modulation signals having different input levels are input after a transmission AMP that is a GaN AMP having a poor gate/drain lag is turned on. In FIG. 17, the horizontal axis represents a time, and the vertical axis represents a deviation in drain current Ids. Here, the deviation in Ids on the vertical axis is obtained by setting Idq (an idle current when set at the time of no signal) to Ids=90 mA, and then expressing Ids at the time of signal amplification at each time after a transmission signal is input to the transmission AMP as a difference from Ids=Idq before the transmission signal is applied to the transmission AMP. Therefore, "0 (A)" on the vertical axis in the drawing corresponds to Ids=90 mA before the transmission signal is input. In FIG. 17, while the drain current Ids is fixed at 90 mA, the input level of the RF modulation signal is changed within a range of 33.7 dBm to 45.7 dBm.

As illustrated in FIG. 17, even in the transmission AMP having a poor gate/drain lag, the higher the input level of the RF modulation signal input to the transmission AMP after the transmission AMP is turned on, the shorter the time taken until the drain current Ids is recovered to the original drain current Ids (=90 mA). In the example of FIG. 17, when the input level of the RF modulation signal is set to 45.7 dBm, which is the highest, the time taken until the drain current Ids is recovered to the original drain current Ids is shortened the most.

Therefore, in the present example embodiment, on the basis of the above-described knowledge, by inserting a high-level AMP stabilization signal that is as broadband as possible (a frequency expandable to an operation setting for each component carrier (CC)) similarly to a frequency characteristic of an impulse in a time domain preceding the time domain of the DL signal, the AMP stabilization signal passes through the transmission AMP before the DL signal passes through the transmission AMP. Note that the AMP stabilization signal is preferably inserted in a time domain immediately preceding the time domain of the DL signal.

In this way, by inputting the AMP stabilization signal to the transmission AMP before a head symbol of the DL signal is input to the transmission AMP, a current collapse and a gate/drain lag of the transmission AMP are resolved early. By doing so, characteristic variations caused by the current collapse and the gate/drain lag of the transmission AMP can be converged early, and the gain, the output, and the non-linear distortion characteristics such as AM-AM/AM-PM of the transmission AMP can be stabilized. By doing so, since occurrences of many defects caused by the overshoot of the EVM of the head symbol of the DL signal are avoided, the signal quality is ensured from the head symbol of the DL signal or the head symbol of any one of the DL slots. In addition, since the AM-AM/AM-PM characteristic of the transmission AMP is already stable in the head symbol section of the DL signal at the time point when the head symbol of the DL signal is input to the transmission AMP, the head symbol and the subsequent symbols of the DL signal are stably distortion-compensated by the DPD in the TX that is a transmitter. This also contributes to ensuring the signal quality of the DL signal from the head symbol. Note that the TX is provided in a TRX that is a transceiver.

Figure 18:
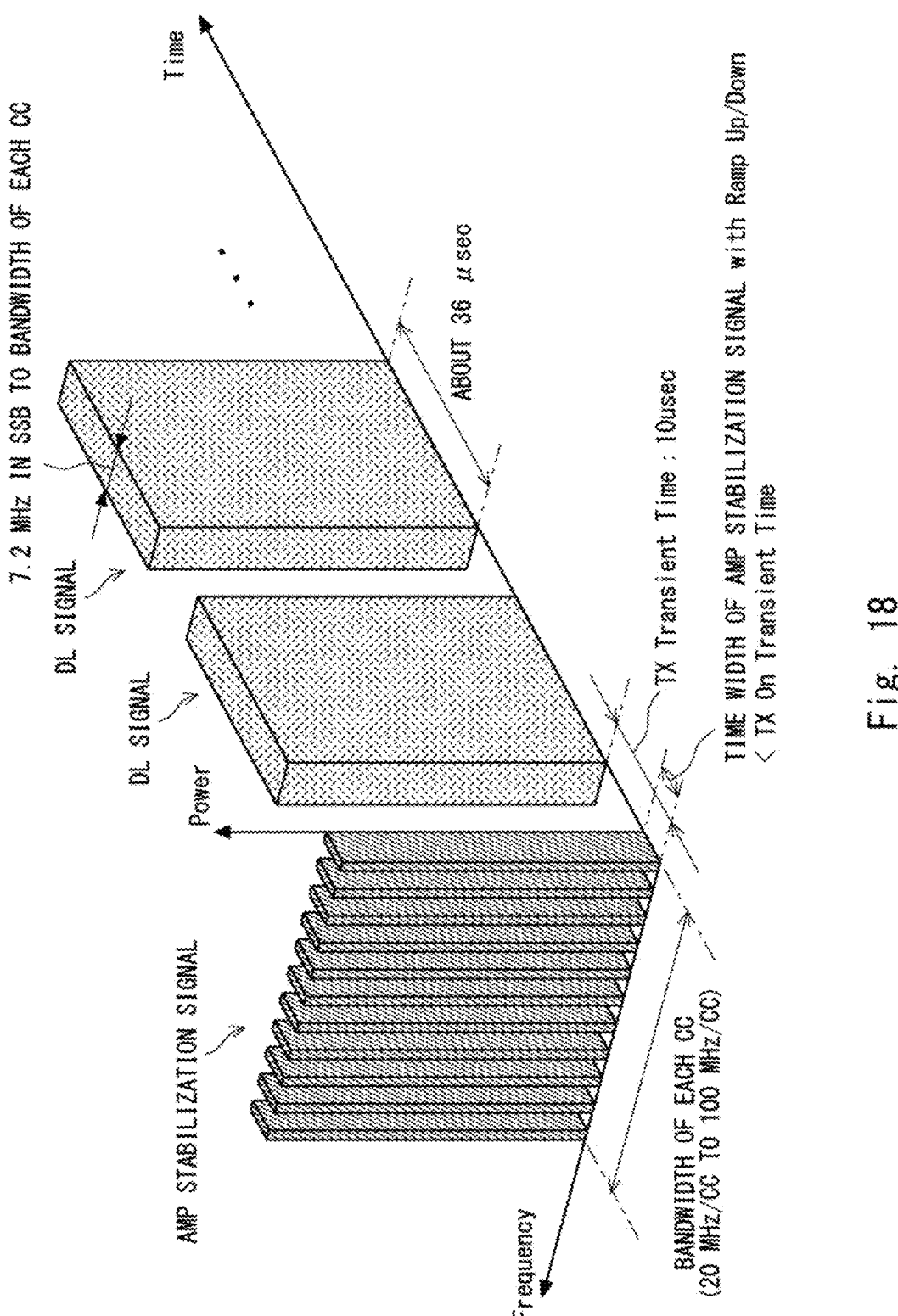
FIG. 18 is a diagram illustrating an example in which an AMP stabilization signal is arranged in a time direction, a frequency direction, and a power direction.
Figure 19:
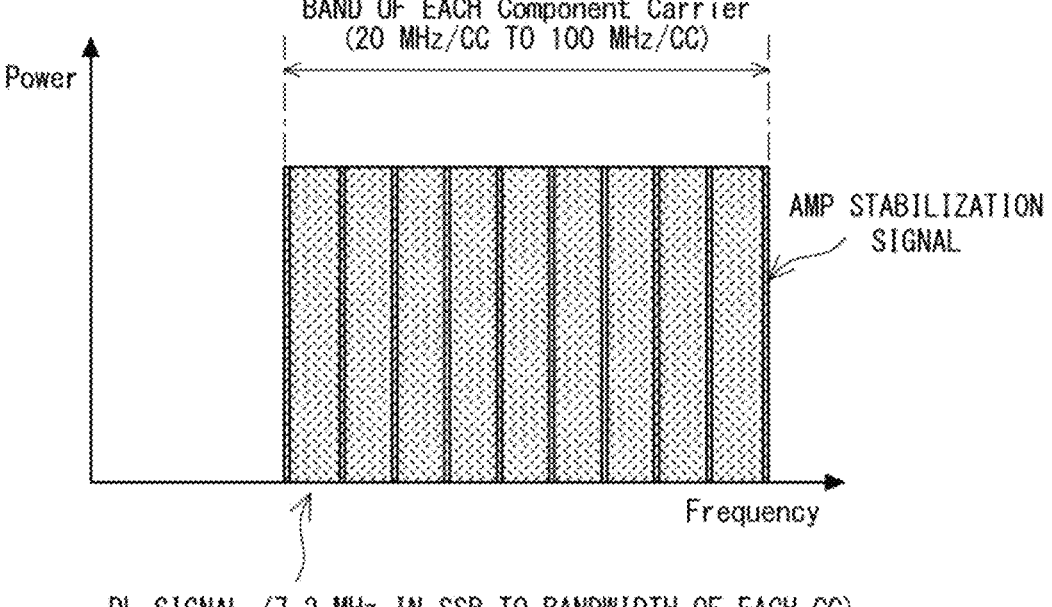
FIG. 19 is a diagram illustrating an example in which in an AMP stabilization signal is arranged in the frequency direction and the power direction.
Figure 20:
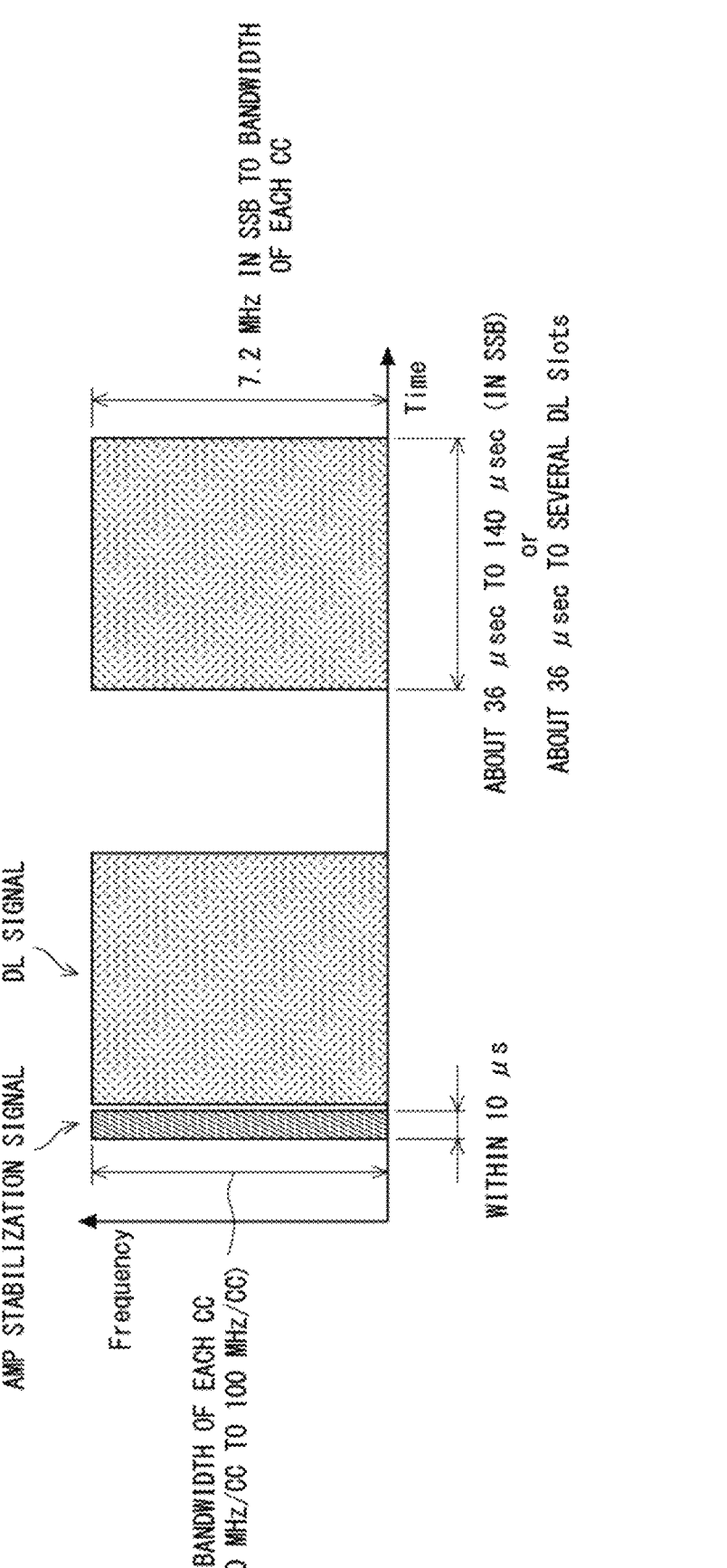
FIG. 20 is a diagram illustrating an example in which an AMP stabilization signal is arranged in the time direction and the frequency direction.

FIG. 18 is a diagram illustrating an example in which an AMP stabilization signal is arranged in a time direction, a frequency direction, and a power direction. In addition, FIG. 19 is a diagram illustrating an example in which in an AMP stabilization signal is arranged in the frequency direction and the power direction. In addition, FIG. 20 is a diagram illustrating an example in which an AMP stabilization signal is arranged in the time direction and the frequency direction. In FIGS. 18 to 20, the DL signal is assumed to be a slot-based signal or a symbol-based signal.

As illustrated in FIGS. 18 to 20, the AMP stabilization signal is, for example, a signal in an orthogonal frequency division multiplexing (OFDM) format. Furthermore, the AMP stabilization signal is a signal having an amplitude probability density of a Reighley distribution with a peak to average power ratio (PAPR) of 14 dB. In addition, the AMP stabilization signal passes through crest factor reduction (CFR) arranged at a stage preceding the DPD in the TX, and thereafter, the PAPR of the AMP stabilization signal is soft-clipped to a threshold (about 7 to 8 dB) of the CFR. Note that the CFR is executed for the purpose of avoiding a failure, non-compensation of DPD, resulting from an occurrence of significantly high-order distortion due to hard clipping in the transmission AMP.

In addition, the AMP stabilization signal is arranged in a time domain before the head symbol of the DL slot or the symbol of any one of the DL slots. For example, in the TDD system, a transient period called a Tx On Transient period is set as a period for switching the TX from a turn-off state to a turn-on state. Therefore, in a situation under the TDD system, the AMP stabilization signal is arranged in a time domain within the Tx On Transient period before the DL signal. For example, in 3GPP (Third GPP) NR (New Radio) (3GPP TS 38.104 V15.16.0 (2021-12) and 3GPP TS 38.141-1 V15.11.0 (2021-12)), the Tx On Transient period is defined as 10 μsec. In this case, a time width of a signal obtained by adding Ramp Up/Down to the AMP stabilization signal is set within 10 μs. The Ramp Up/Down is a signal inserted to prevent an impulse spectrum from spreading. The time width of the DL signal is a time width of about 36 μsec to several DL slots. Alternatively, the time width of the DL signal is 140 μsec during an operation in a synchronization signal (SS)/physical broadcast channel (PBCH) block (SSB). Here, the SSB is a synchronization signal/broadcast channel block including an SS and a PBCH. The SSB is periodically transmitted from a base station mainly to detect a cell ID and a reception timing when a terminal starts communication, but is also used for measuring the reception quality for each cell in 5G NR.

Furthermore, as described above, the input of the RF modulation signal in addition to the input of the impulse promotes the early recovery of the characteristics of the transmission AMP. Therefore, the frequency bandwidth of the AMP stabilization signal is set to a wide band equivalent to a frequency bandwidth of each component carrier used for transmitting a DL signal. The frequency bandwidth of each component carrier is about 20 MHz to 100 MHz. Note that the frequency bandwidth of the DL signal is about 7.2 MHz during operation in the SSB, and is a frequency bandwidth of each component carrier under an actual operation DL signal such as a physical downlink shared channel (PDSCH). Furthermore, as described above, the increase in the input level of the RF modulation signal further promotes the early recovery of the characteristics of the transmission AMP. Therefore, the power level of the AMP stabilization signal is set to a power level at which the output of the transmission AMP becomes a maximum rated root mean square (RMS) level, and which is a high level that is the same power level as that of the DL signal.

As described above, according to the present example embodiment, by inserting a high-level broadband AMP stabilization signal in a time domain before the DL signal, the AMP stabilization signal is caused to pass through the transmission AMP before the DL signal passes through the transmission AMP.

In this way, by inputting the AMP stabilization signal to the transmission AMP before a head symbol of the DL signal is input to the transmission AMP, a current collapse and a gate/drain lag of the transmission AMP are resolved early. By doing so, characteristic variations caused by the current collapse and the gate/drain lag of the transmission AMP are converged early, and the gain, the output, and the nonlinear distortion characteristics such as AM-AM/AM-PM of the transmission AMP are stabilized. By doing so, since occurrences of many defects caused by the overshoot of the EVM of the head symbol of the DL signal are avoided, the signal quality is ensured from the head symbol of the DL signal or the head symbol of any one of the DL slots. In addition, since the AM-AM/AM-PM characteristic of the transmission AMP is already stable in the head symbol section of the DL signal at the time point when the head symbol of the DL signal is input to the transmission AMP, the head symbol and the subsequent symbols of the DL signal are stably distortion-compensated by the DPD in the TX. This also contributes to ensuring the signal quality of the DL signal from the head symbol.

Furthermore, for example, the AMP stabilization signal is arranged in a time domain within the Tx On Transient period before the DL signal, but the Tx On Transient period is defined as 10 μsec in 3GPP NR. Therefore, the nonlinear distortion characteristics such as AM-PM of the transmission AMP are stabilized within the Tx On Transient period of 10 μs, and then compensation for distortion by the DPD is applied to the DL signal.

Therefore, by adopting the configuration of the present example embodiment, even in the transmission AMP that is a GaN AMP having a poor current collapse and a poor gate/drain lag, it is possible to achieve a max throughput according to an SNR even for the maximum MCS in all symbols of the DL signal (including the head symbol of the DL signal and the head symbol of any one of the DL slots). Therefore, while the system performance of the TDD system is maintained at the highest level, optimal low power consumption according to user traffic can be achieved.

Hereinafter, the AMP stabilization signal will be described in more detail.

Figure 21:
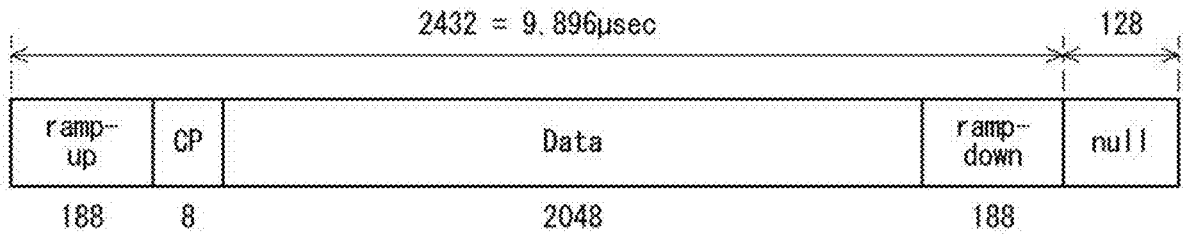
FIG. 21 is a diagram illustrating an example of a data structure of an AMP stabilization signal.

FIG. 21 is a diagram illustrating an example of a data structure of an AMP stabilization signal.

As illustrated in FIG. 21, the AMP stabilization signal has a structure in which a cyclic prefix (CP) is added to a head of a data portion, and ramp-up and ramp-down are added before and after the CP, respectively, with a null at a tail. In addition, the ramp-up is 188 samples, the CP is 8 samples, the data portion is 2048 samples, the ramp-down is 188 samples, and the null is 128 samples. In addition, the sum of the ramp-up, the CP, the data portion, and the ramp-down is 2432 samples, and the total obtained by adding the null thereto is 2560 samples.

In addition, other parameters of the AMP stabilization signal are, for example, as follows.

Transmission speed: 245.76 MSPS

Frequency bandwidth: frequency bandwidth of component carrier

Figure 22:
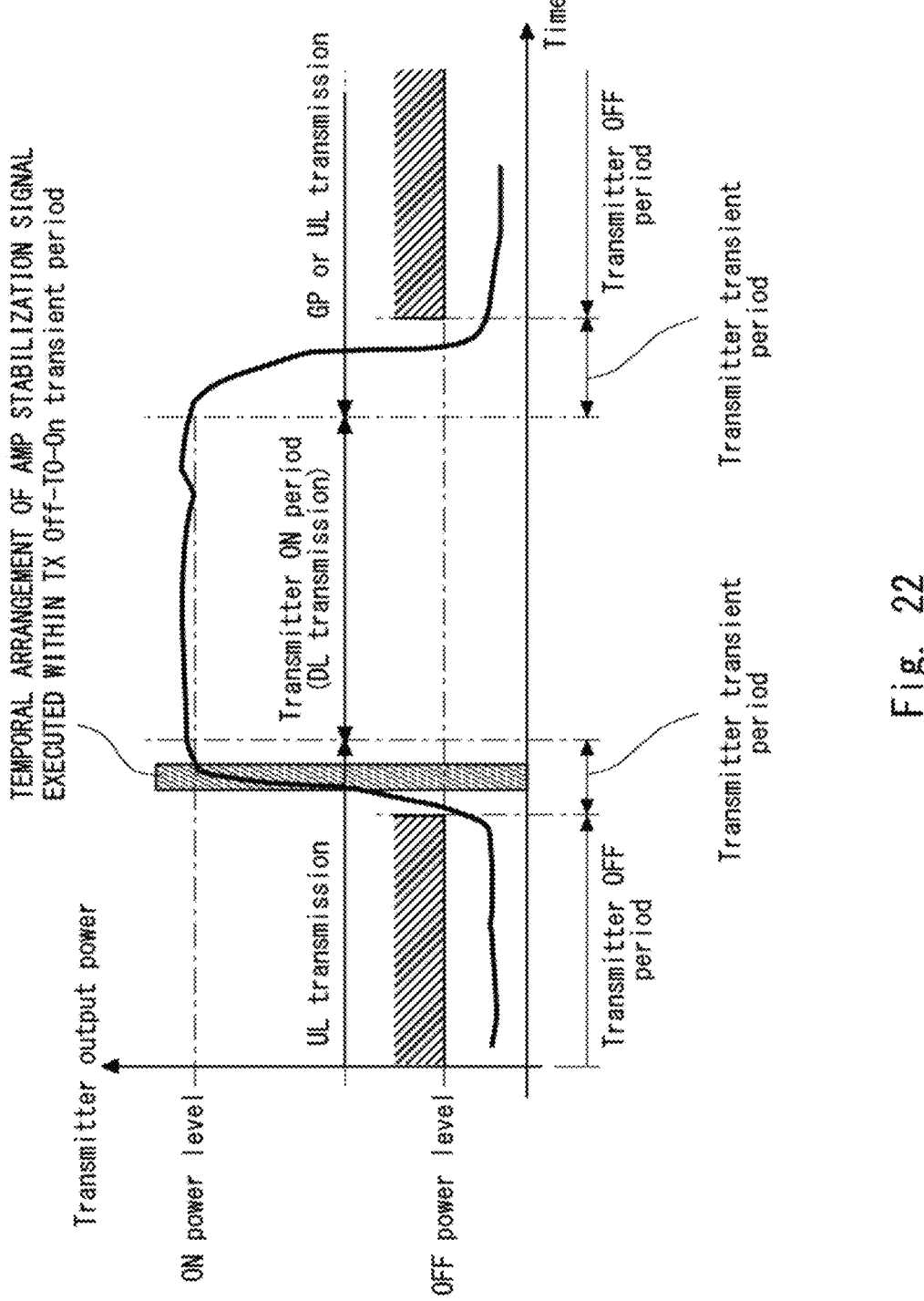
FIG. 22 is a diagram illustrating an example of temporal arrangement of an AMP stabilization signal.

Power level: power level at which output of transmission AMP becomes maximum rated RMS level Modulation scheme: quadrature phase-shift keying (QPSK) to 256 QAM PAPR: 14 dB, and 7 to 8 dB after passing CFR FIG. 22 is a diagram illustrating an example of temporal arrangement of an AMP stabilization signal.

As illustrated in FIG. 22, the AMP stabilization signal is arranged, for example, in a time domain within the Tx On Transient period, which is a period for switching the TX from a turn-off state to a turn-on state. The Tx On Transient period is defined as 10 μsec in 3GPP NR.

Figure 23:
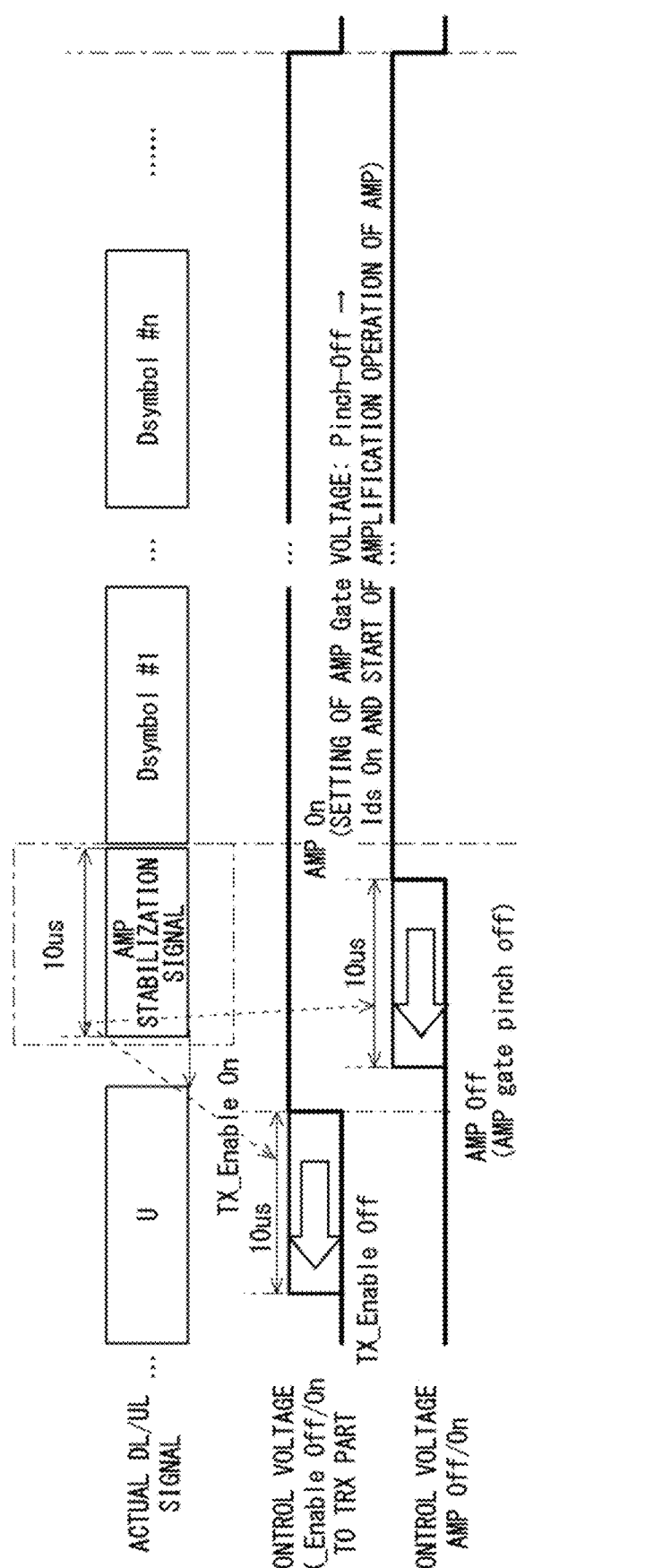
FIG. 23 is a timing chart illustrating an example of a change in processing start timing accompanying the insertion of the AMP stabilization signal in the AAS.

FIG. 23 is a timing chart illustrating an example of a change in processing start timing accompanying the insertion of the AMP stabilization signal in the AAS.

As illustrated in FIG. 23, in the present example embodiment, the AAS causes the AMP stabilization signal to be inserted in a time domain preceding the time domain of the DL signal. Therefore, when the AMP stabilization signal has a length of 10 μsec, the AAS advances the timing of applying a control voltage TX_Enable On for enabling the TX in the TRX to the TX by 10 μsec. In addition, the AAS also advances the timing of applying a control voltage AMP On for turning on the transmission AMP to the transmission AMP by 10 μsec.

EXAMPLE EMBODIMENT

Hereinafter, a wireless communication apparatus according to an example embodiment of the present disclosure will be described. Hereinafter, the wireless communication apparatus according to the present example embodiment will be described as an AAS that transmits a DL signal as a transmission signal to each UE.

Figure 24:
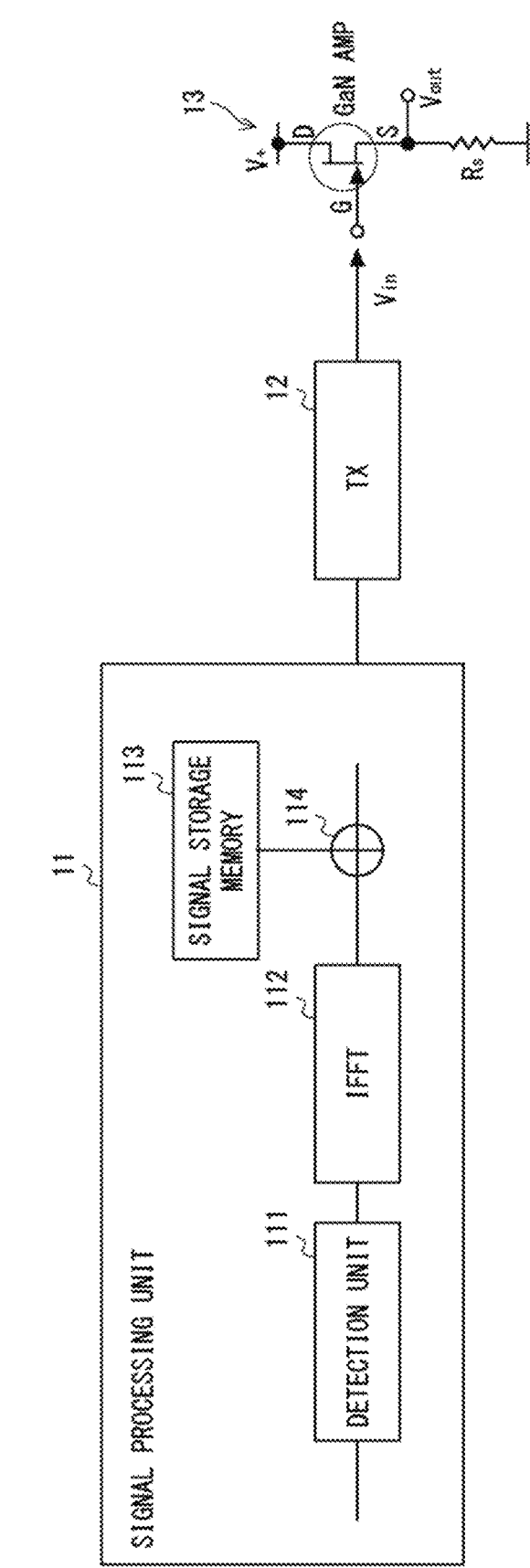
FIG. 24 is a diagram illustrating a configuration example of an AAS according to an example embodiment.

FIG. 24 is a diagram illustrating a configuration example of an AAS 10 according to the present example embodiment. Note that FIG. 24 illustrates only the main components of the AAS 10 according to the present example embodiment, and illustration of other components (e.g., an antenna or the like) is omitted.

As illustrated in FIG. 24, the AAS 10 according to the present example embodiment includes a signal processing unit 11, a TX 12 that is a transmitter, and a transmission AMP 13 that is a GaN AMP. Furthermore, the signal processing unit 11 includes a detection unit 111, an inverse fast Fourier transform (IFFT) unit 112, a signal storage memory 113, and an adder 114.

The IFFT unit 112 converts a DL signal from a frequency domain signal into a time domain signal.

The detection unit 111 is provided at a stage preceding the IFFT unit 112. The detection unit 111 autonomously detects whether there is a DL signal in a frequency domain. For example, the detection unit 111 detects whether there is a DL signal by performing a threshold determination in the frequency domain.

The signal storage memory 113 stores an AMP stabilization signal for stabilizing the characteristics of the transmission AMP 13. Specifically, the AMP stabilization signal is a signal that early converges the current collapse and the gate/drain lag of the transmission AMP 13 when input to the transmission AMP 13, thereby early stabilizing the gain, the output, and the nonlinear distortion characteristics of the transmission AMP 13.

Figure 25:
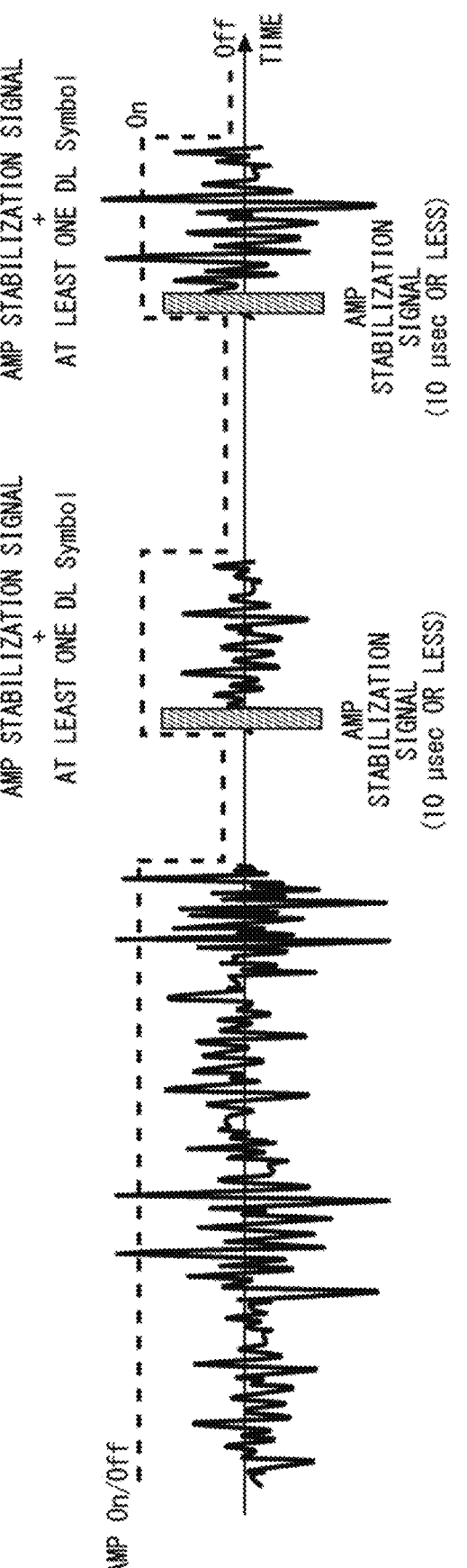
FIG. 25 is a diagram illustrating an example in which an AMP stabilization signal is inserted in a time domain preceding a time domain of a DL signal in an AAS according to an example embodiment.

When a DL signal is detected by the detection unit 111, after the DL signal is output from the IFFT unit 112, the adder 114 adds the AMP stabilization signal stored in the signal storage memory 113 to a time domain preceding a time domain of the DL signal. In this way, the AMP stabilization signal is inserted in the time domain preceding the time domain of the DL signal. At this time, the adder 114 inversely calculates a time period during which the DL signal exists from a time at which the DL signal is emitted from an antenna in consideration of the processing time of the TX 12, and causes the AMP stabilization signal to be inserted in a head of the time period. FIG. 25 is a diagram illustrating an example in which the AMP stabilization signal is inserted in the time domain preceding the time domain of the DL signal.

By doing so, the AMP stabilization signal can pass through the TX 12 and the transmission AMP 13 before the DL signal passes through the TX 12 and the transmission AMP 13.

Here, during a TDD operation of the AAS 10, the time domain preceding the time domain of the DL signal is, for example, a Tx On Transient period, which is a period for switching the TX 12 from a turn-off state to a turn-on state. Therefore, the time width of the AMP stabilization signal is set within the time width of the Tx On Transient period. The Tx On Transient period is defined as 10 μsec in 3GPP NR.

In addition, the frequency bandwidth of the AMP stabilization signal is set to a frequency bandwidth of a component carrier used for transmitting a DL signal.

In addition, the power level of the AMP stabilization signal is set to a power level at which the output of the transmission AMP 13 becomes a maximum rated RMS level, and which is the same power level as that of the DL signal.

The TX 12 is provided at a stage following the signal processing unit 11, converts the DL signal or the AMP stabilization signal output from the signal processing unit 11 from an in-phase/quadrature-phase (IQ) signal to an RF signal, and outputs the RF signal to the transmission AMP 13. Note that the TX 12 is provided in a TRX (not illustrated) which is a transceiver. As described above, the TX 12 includes a DPP, a CFR provided at a stage preceding the DPD, and the like, but illustration thereof is omitted.

The transmission AMP 13 is provided at a stage following the TX 12, and amplifies the DL signal or the AMP stabilization signal output from the TX 12 and outputs the amplified signal. The DL signal or the AMP stabilization signal output from the transmission AMP 13 is transmitted to each UE via an antenna (not illustrated).

Figure 26:
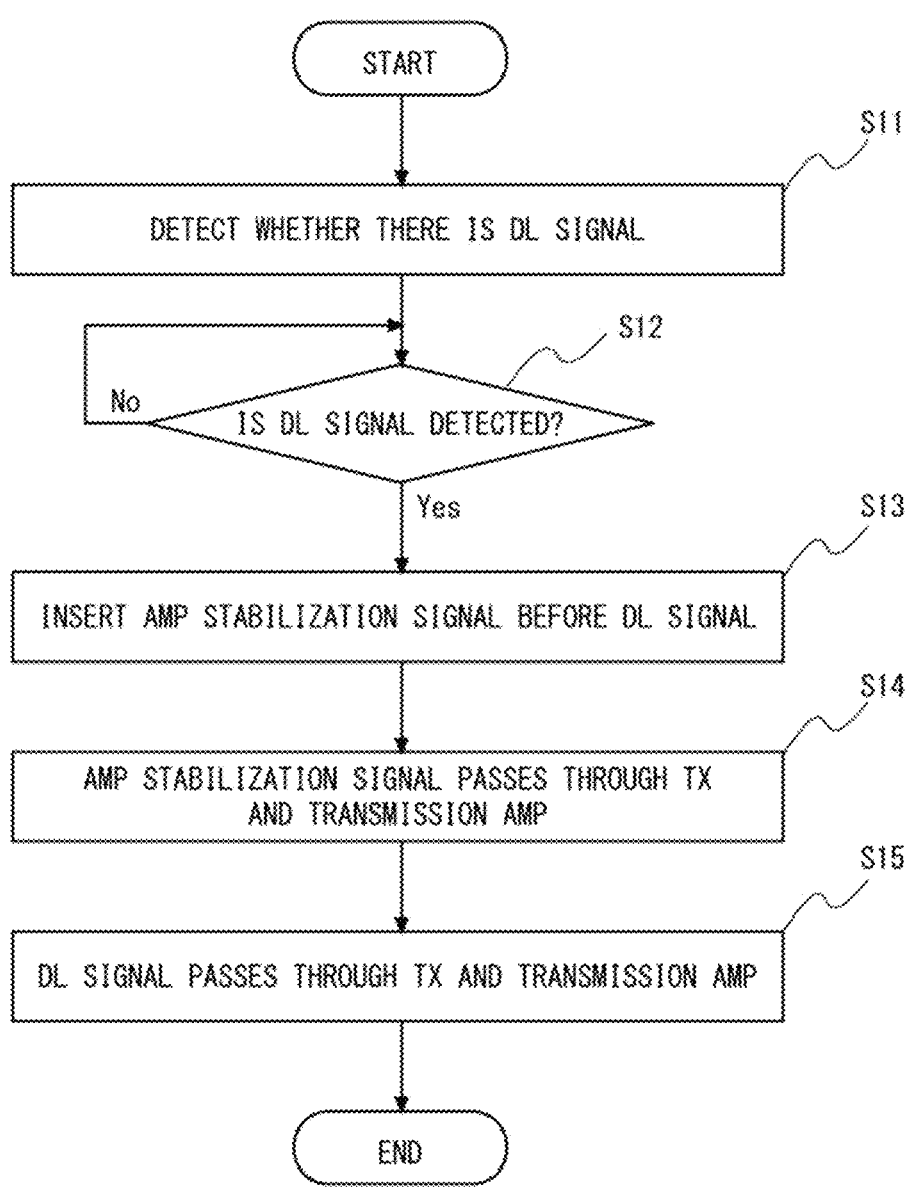
FIG. 26 is a flowchart for explaining a schematic operation example of an AAS according to an example embodiment.

FIG. 26 is a flowchart illustrating a schematic operation example of the AAS 10 according to the present example embodiment. As illustrated in FIG. 26, the detection unit 111 detects whether there is a DL signal (step S11). When the DL signal is detected by the detection unit 111 (Yes in step S12), the adder 114 causes the AMP stabilization signal to be inserted in a time domain preceding the time domain of the DL signal (step S13). Therefore, first, the AMP stabilization signal passes through the TX 12 and the transmission AMP 13 (step S14), whereby the gain, the output, and the nonlinear distortion characteristics of the transmission AMP 13 are stabilized. Thereafter, the DL signal passes through the TX 12 and the transmission AMP 13 (step S15).

As described above, according to the present example embodiment, when detecting a DL signal, the signal processing unit 11 causes an AMP stabilization signal to be inserted in a time domain preceding the time domain of the DL signal, so that the AMP stabilization signal passes through the TX 12 and the transmission AMP 13 before the DL signal passes through the TX 12 and the transmission AMP 13.

In this way, by inputting the AMP stabilization signal to the transmission AMP 13 before a head symbol of the DL signal is input to the transmission AMP 13, a current collapse and a gate/drain lag of the transmission AMP 13 are resolved early. By doing so, characteristic variations caused by the current collapse and the gate/drain lag of the transmission AMP 13 are converged early, and the gain, the output, and the nonlinear distortion characteristics such as AM-AM/AM-PM of the transmission AMP 13 are stabilized. By doing so, it is possible to suppress an occurrence of an overshoot in an EVM of a head symbol of the DL signal and to maintain communication quality in the head symbol of the DL signal. As a result, since occurrences of many defects caused by the overshoot of the EVM of the head symbol of the DL signal are avoided, the signal quality is ensured from the head symbol of the DL signal or the head symbol of any one of the DL slots. In addition, since the AM-AM/AM-PM characteristic of the transmission AMP 13 is already stable in the head symbol section of the DL signal at the time point when the head symbol of the DL signal is input to the transmission AMP 13, the head symbol and the subsequent symbols of the DL signal are stably distortion-compensated by the DPD in the TX 12. This also contributes to ensuring the signal quality of the DL signal from the head symbol.

Hereinafter, effects of the present example embodiment will be described in detail with reference to the drawings.

Figure 27:
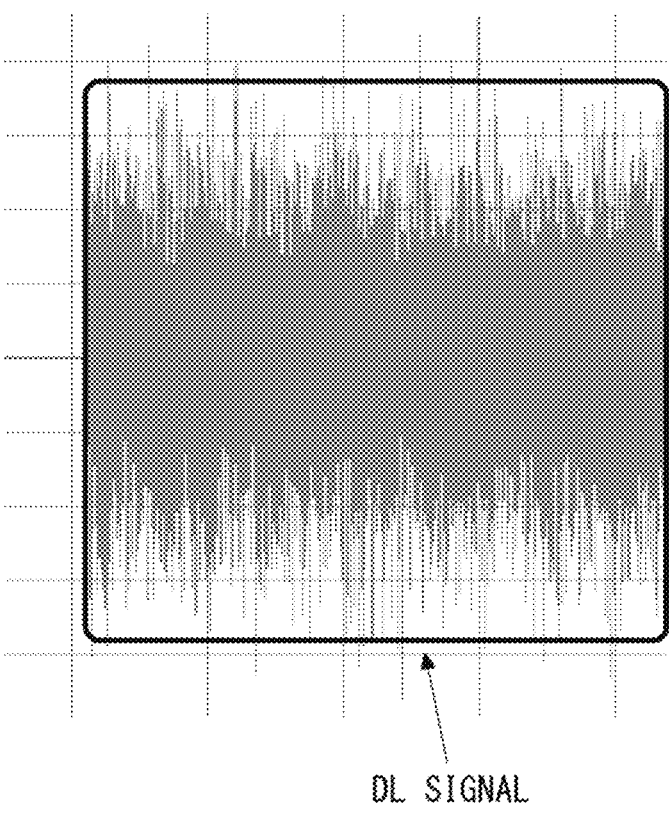
FIG. 27 is a diagram illustrating an example of an amplitude waveform of a DL signal in an AAS equipped with a transmission AMP that is a GaN AMP having a poor gate/drain lag, with no AMP stabilization signal being applied thereto.
Figure 28:
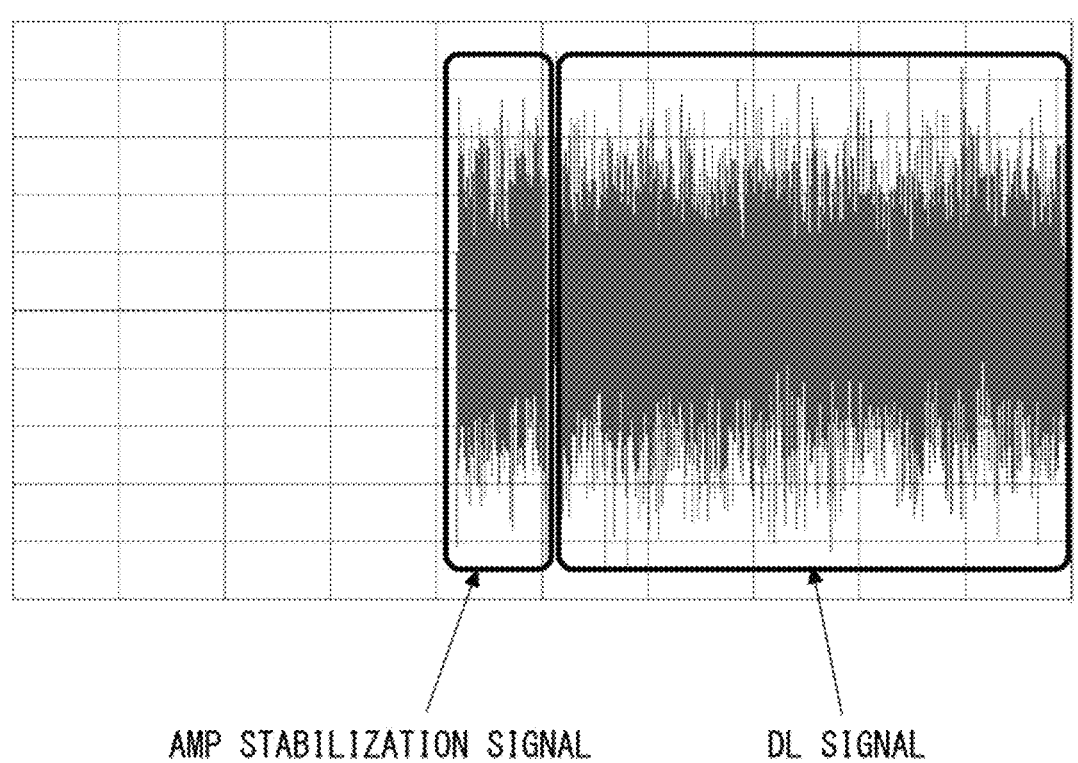
FIG. 28 is a diagram illustrating examples of amplitude waveforms of an AMP stabilization signal and a DL signal in an AAS equipped with a transmission AMP that is a GaN AMP having a poor gate/drain lag, with an AMP stabilization signal being applied to the transmission AMP, according to an example embodiment.

FIG. 27 is a diagram illustrating an example of an amplitude waveform of a DL signal in an AAS equipped with a transmission AMP that is a GaN AMP having a poor gate/drain lag, with no AMP stabilization signal being applied thereto. In addition, FIG. 28 is a diagram illustrating examples of amplitude waveforms of an AMP stabilization signal and a DL signal in the AAS 10 equipped with the transmission AMP 13 that is a GaN AMP having a poor gate/drain lag, with the AMP stabilization signal being applied to the transmission AMP 13, according to the present example embodiment. In FIGS. 27 and 28, the horizontal axis represents a time and the vertical axis represents an amplitude. The difference between the amplitude waveforms in FIGS. 27 and 28 appears as a difference between characteristics of EVMs in FIGS. 29 and 30 to be described below.

US 12,671,370 B2

15

Figure 29:
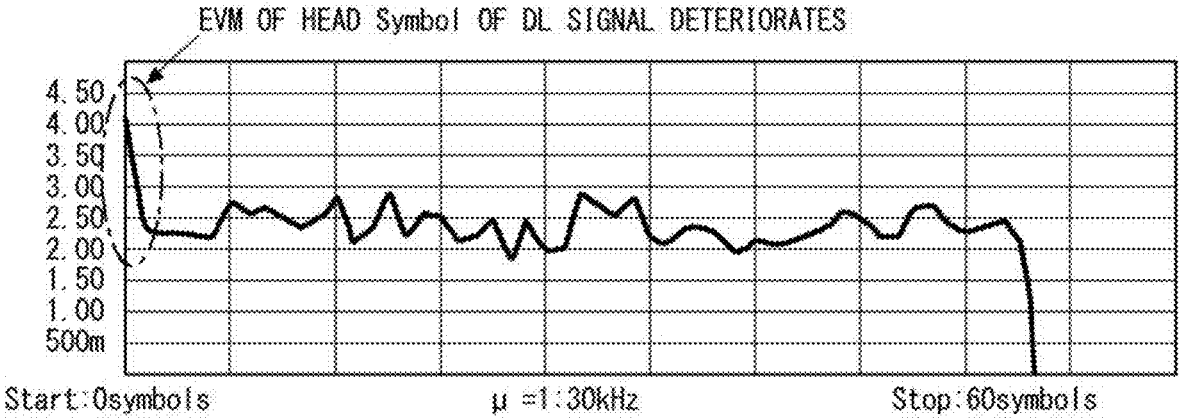
FIG. 29 is a diagram illustrating an example of a characteristic of an EVM when a transmission AMP is turned on in an AAS equipped with the transmission AMP that is a GaN AMP having a poor gate/drain lag, with no AMP stabilization signal being applied thereto.
Figure 30:
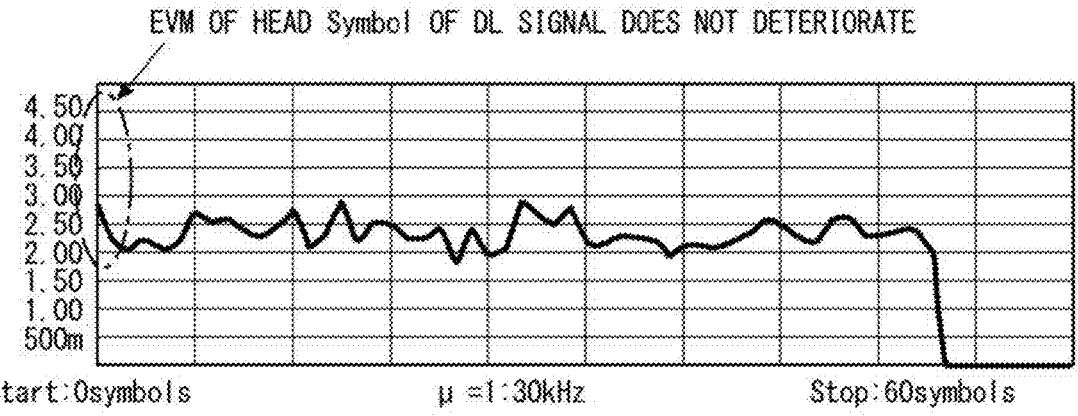
FIG. 30 is a diagram illustrating an example of a characteristic of an EVM when a transmission AMP is turned on in an AAS equipped with the transmission AMP that is a GaN AMP having a poor gate/drain lag, with an AMP stabilization signal being applied to the transmission AMP, according to an example embodiment.

FIG. 29 is a diagram illustrating an example of a characteristic of an EVM when a transmission AMP is turned on in an AAS equipped with the transmission AMP that is a GaN AMP having a poor gate/drain lag, with no AMP stabilization signal being applied thereto. In addition, FIG. 30 is a diagram illustrating an example of a characteristic of an EVM when the transmission AMP 13 is turned on in the AAS 10 equipped with the transmission AMP 13 that is a GaN AMP having a poor gate/drain lag, with an AMP stabilization signal being applied to the transmission AMP 13, according to the present example embodiment. In FIGS. 29 and 30, the horizontal axis represents a symbol, and the vertical axis represents an EVM. Note that, in FIGS. 29 and 30, the transmission AMP is turned on/off only once.

As illustrated in FIG. 29, in a case where the AAS is equipped with a transmission AMP having a poor gate/drain lag with no AMP stabilization signal being applied thereto, in a DL signal immediately after the transmission AMP is turned on, an EVM of a head symbol 1 deteriorates because an overshoot occurs. On the other hand, as illustrated in FIG. 30, in a case where the AAS 10 is equipped with the transmission AMP 13 having a poor gate/drain lag with an AMP stabilization signal being applied to the transmission AMP 13 according to the present example embodiment, in a DL signal immediately after the transmission AMP 13 is turned on, an EVM does not deteriorate because an overshoot is suppressed from a head symbol 1.

Figure 31:
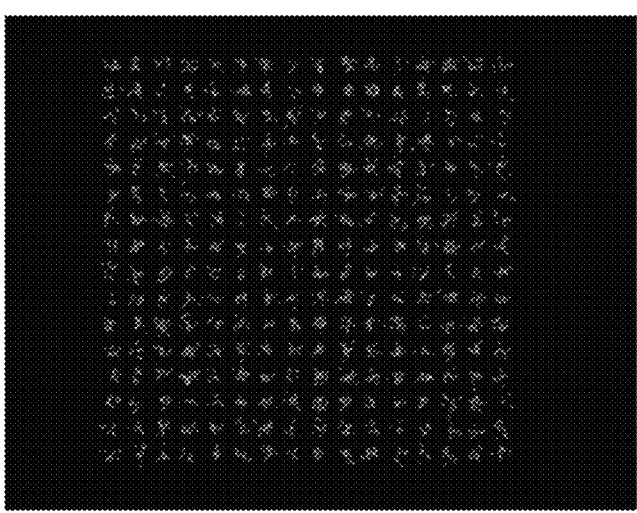
FIG. 31 is a diagram illustrating an example of a constellation of a head symbol of a DL signal immediately after a transmission AMP is turned on in an AAS equipped with the transmission AMP that is a GaN AMP having a poor gate/drain lag with an AMP stabilization signal being applied to the transmission AMP according to an example embodiment.

FIG. 31 is a diagram illustrating an example of a constellation of a head symbol 1 of a DL signal immediately after the transmission AMP 13 is turned on in the AAS 10 equipped with the transmission AMP 13 that is a GaN AMP having a poor gate/drain lag with an AMP stabilization signal being applied to the transmission AMP 13 according to the present example embodiment. Note that an example of a constellation of a head symbol 1 of a DL signal immediately after a transmission AMP is turned on in an AAS equipped with the transmission AMP having a poor gate/drain lag with no AMP stabilization signal being applied thereto is similar to that illustrated in FIG. 11.

Figure 1:
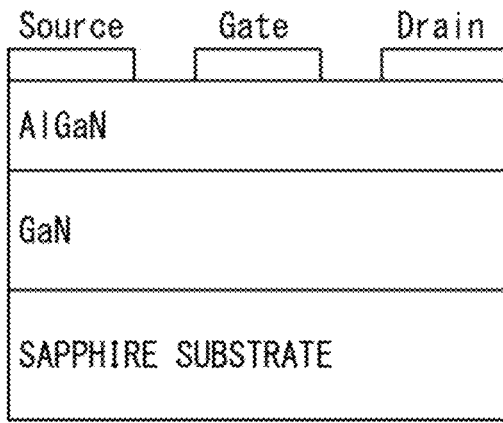
FIG. 1 is a diagram illustrating an example of a structure of a GaN/AlGaN HEMT.
Figure 2:
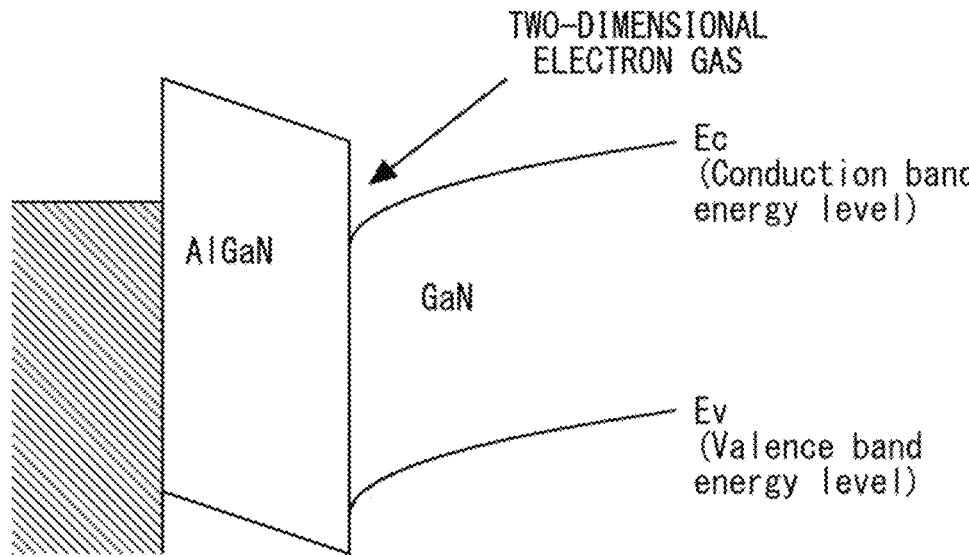
FIG. 2 is a diagram illustrating an example of a band structure of a GaN/AlGaN HEMT.
Figure 3:
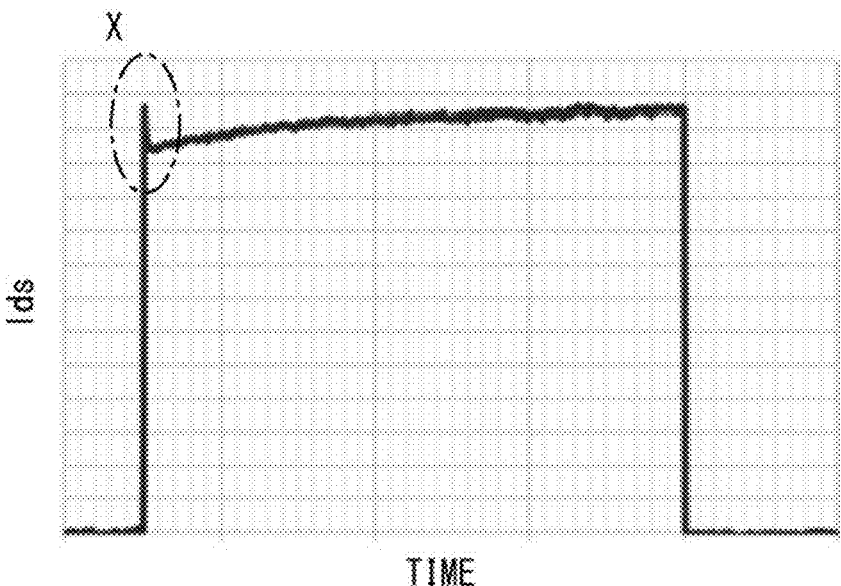
FIG. 3 is a diagram illustrating an example of a characteristic of a drain current Ids when a gate is turned on from a pinch-off state in a transmission AMP that is a GaN AMP.
Figure 4:
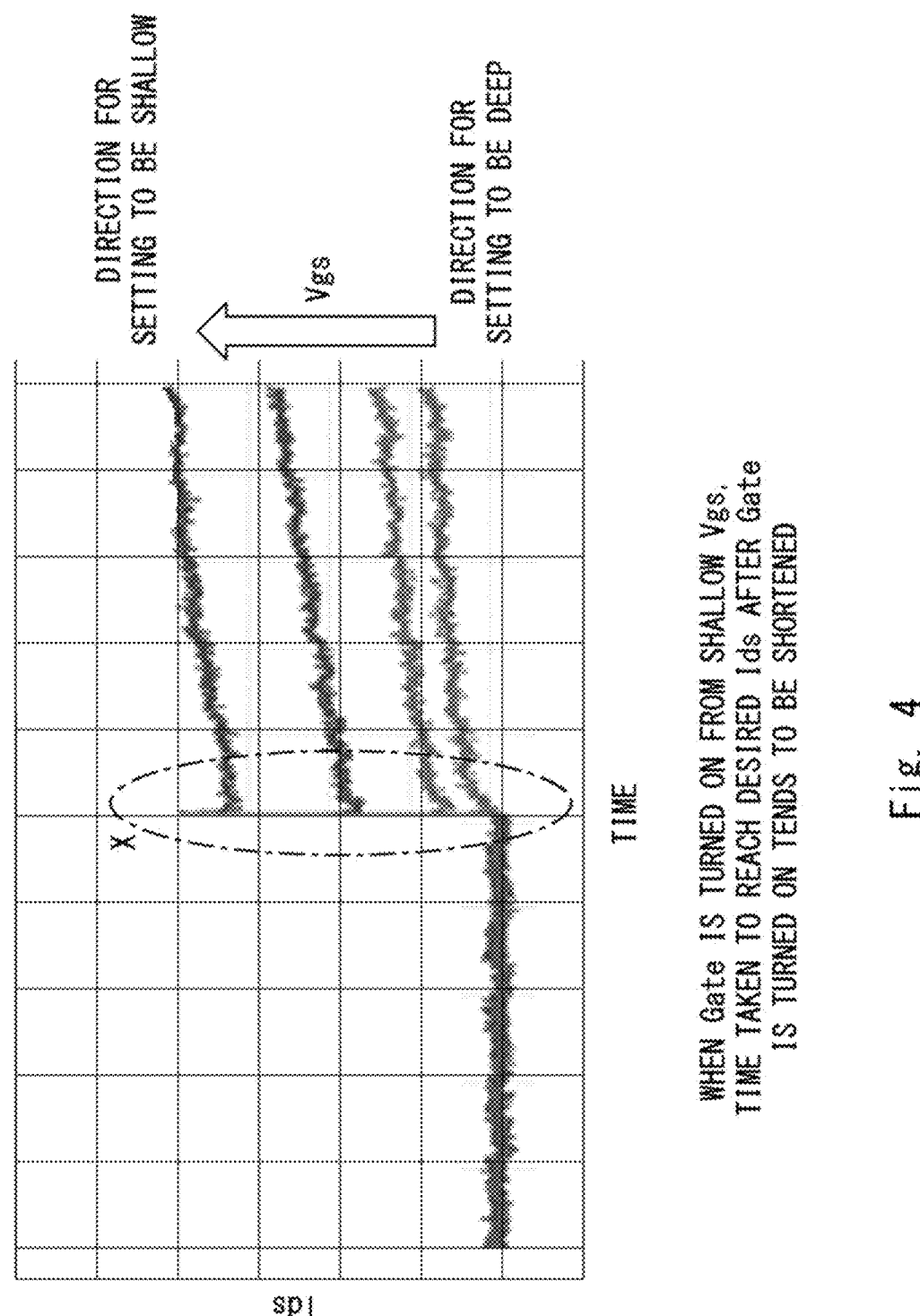
FIG. 4 is an enlarged view of a portion X of FIG. 3.
Figure 5:
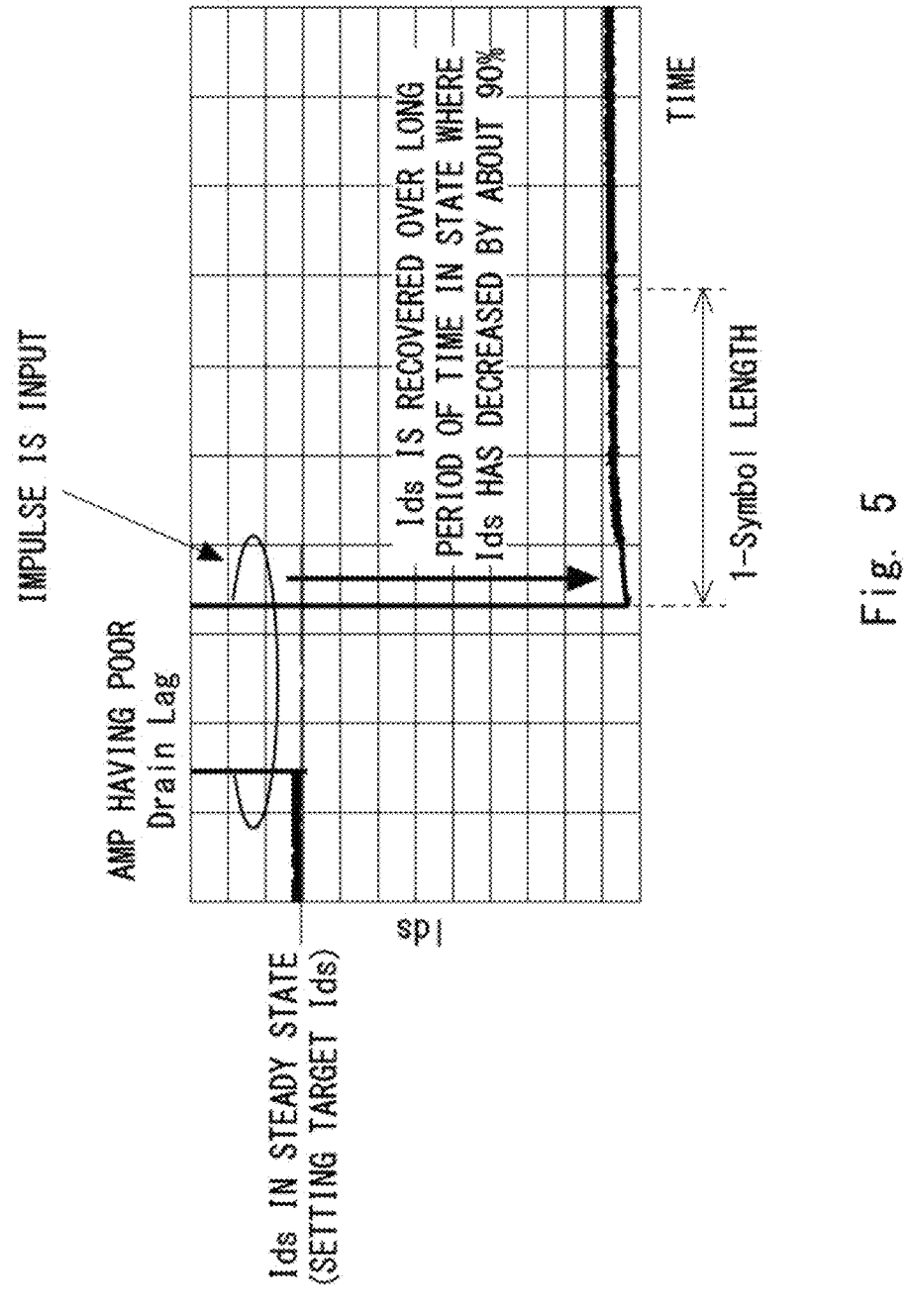
FIG. 5 is a diagram illustrating an example of a characteristic of a drain current Ids when an impulse is input to a transmission AMP that is a GaN AMP having a poor drain lag.
Figure 6:
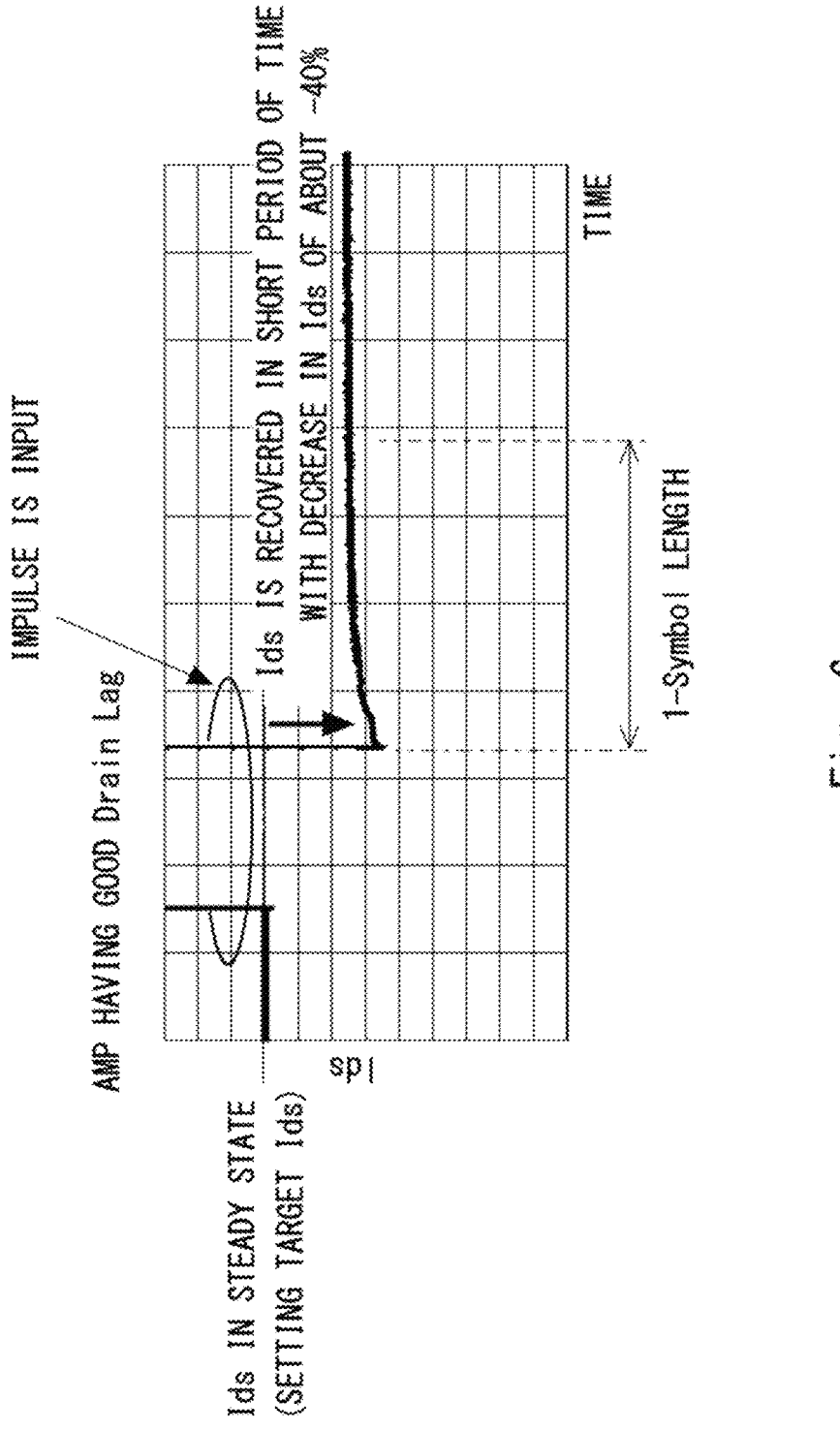
FIG. 6 is a diagram illustrating an example of a characteristic of a drain current Ids when an impulse is input to a transmission AMP that is a GaN AMP having a good drain lag.
Figure 7:
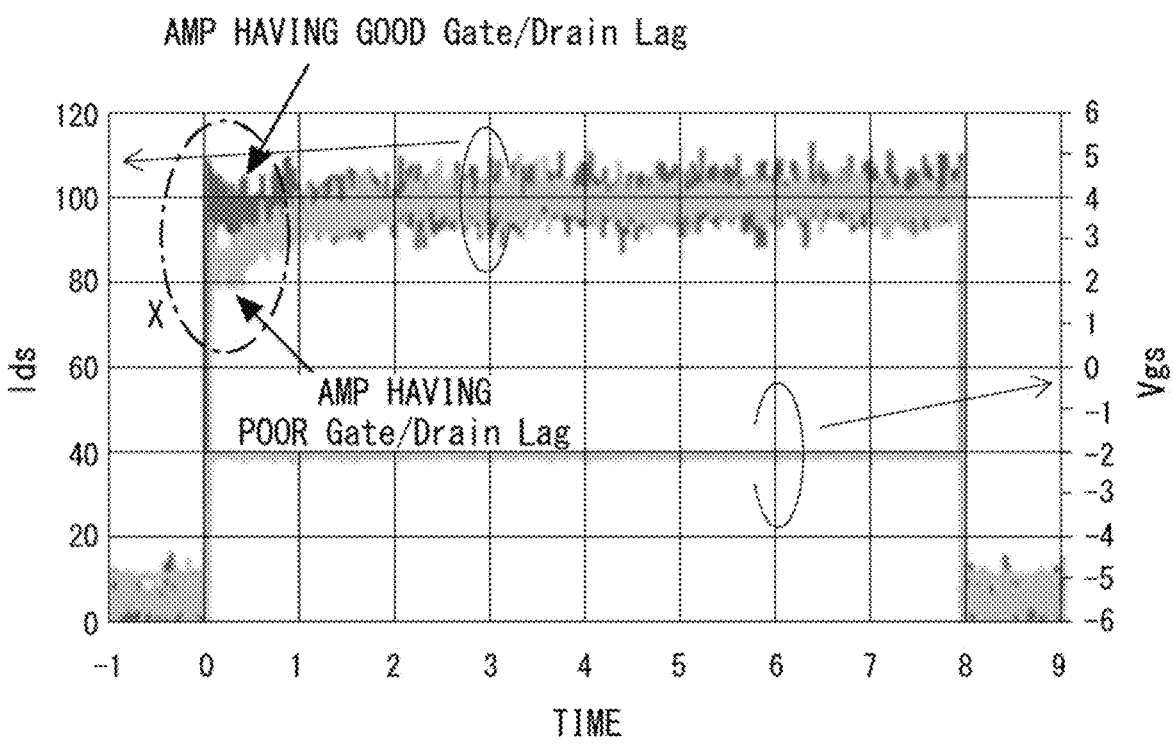
Figure 8:
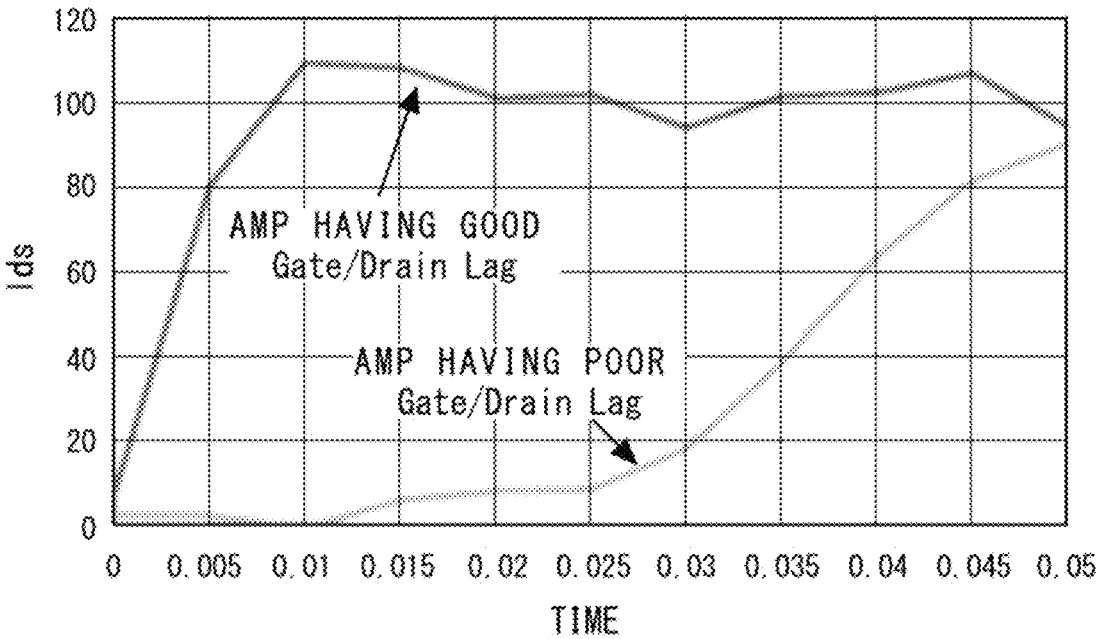
FIG. 8 is an enlarged view of a portion X of FIG. 7.
Figure 9:
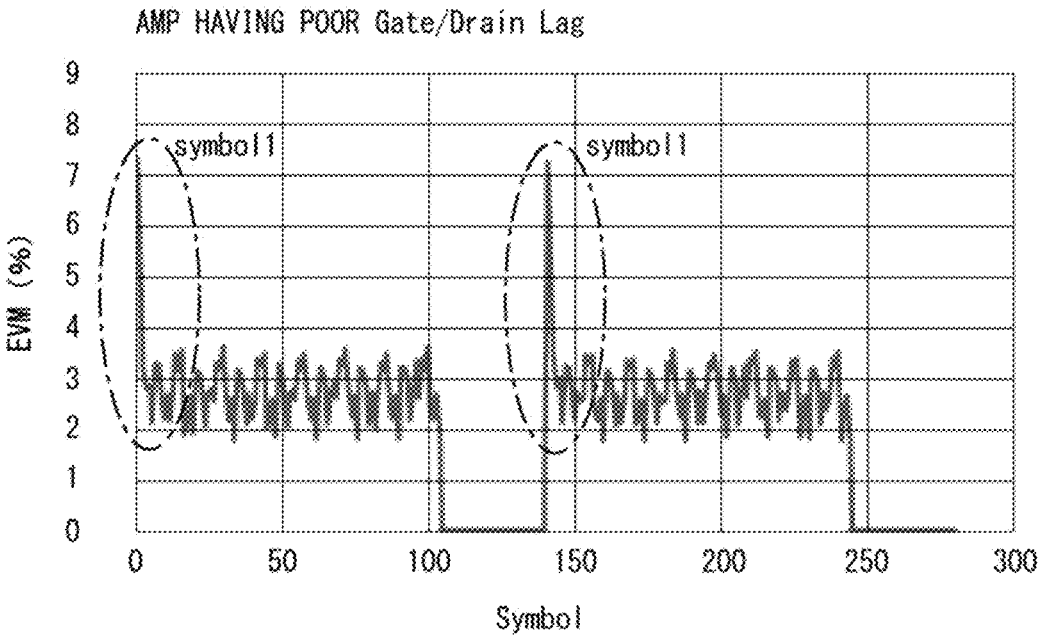
FIG. 9 is a diagram illustrating an example of a characteristic of an EVM when a transmission AMP is turned on in an AAS equipped with the transmission AMP that is a GaN AMP having a poor gate/drain lag.
Figure 10:
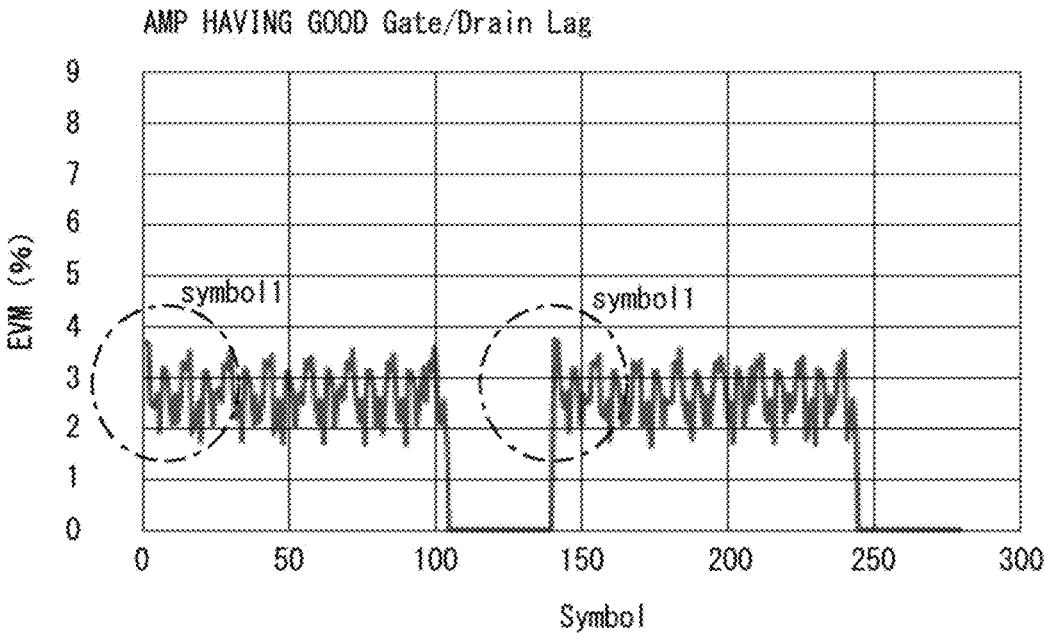
FIG. 10 is a diagram illustrating an example of a characteristic of an EVM when a transmission AMP is turned on in an AAS equipped with the transmission AMP that is a GaN AMP having a good gate/drain lag.
Figure 11:
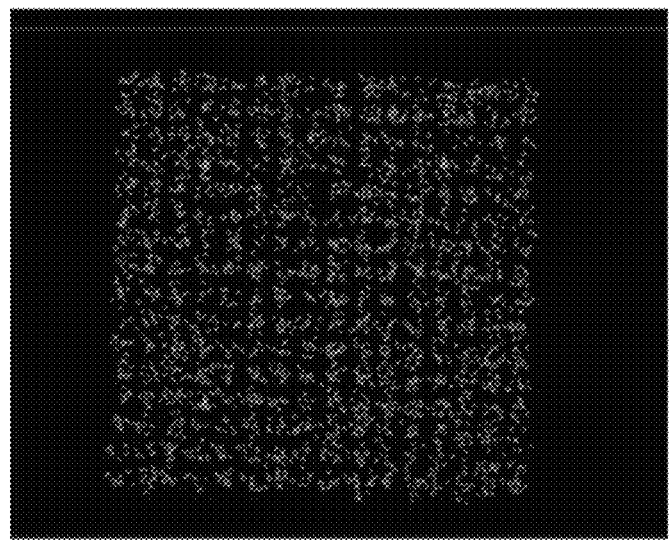
FIG. 11 is a diagram illustrating an example of a constellation of a head symbol in a DL signal immediately after a transmission AMP is turned on in an AAS equipped with the transmission AMP that is a GaN AMP having a poor gate/drain lag.
Figure 12:
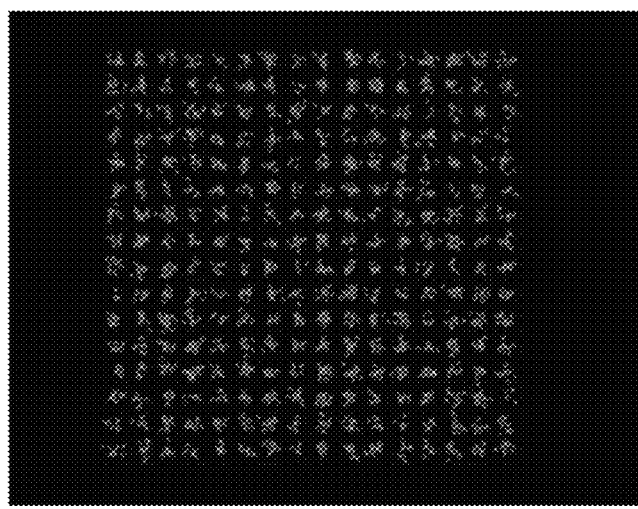
FIG. 12 is a diagram illustrating an example of a constellation of a head symbol in a DL signal immediately after a transmission AMP is turned on in an AAS equipped with the transmission AMP that is a GaN AMP having a good gate/drain lag.

As illustrated in FIG. 11, in a case where the AAS is equipped with a transmission AMP having a poor gate/drain lag with no AMP stabilization signal being applied thereto, a phase rotation occurs in a constellation of a head symbol 1 in a DL signal immediately after the transmission AMP is turned on. On the other hand, as illustrated in FIG. 31, in a case where the AAS 10 equipped with the transmission AMP 13 having a poor gate/drain lag with an AMP stabilization signal being applied to the transmission AMP 13 according to the present example embodiment, a DL signal immediately after the transmission AMP is turned on has a normal constellation from the head symbol 1.

Figure 32:
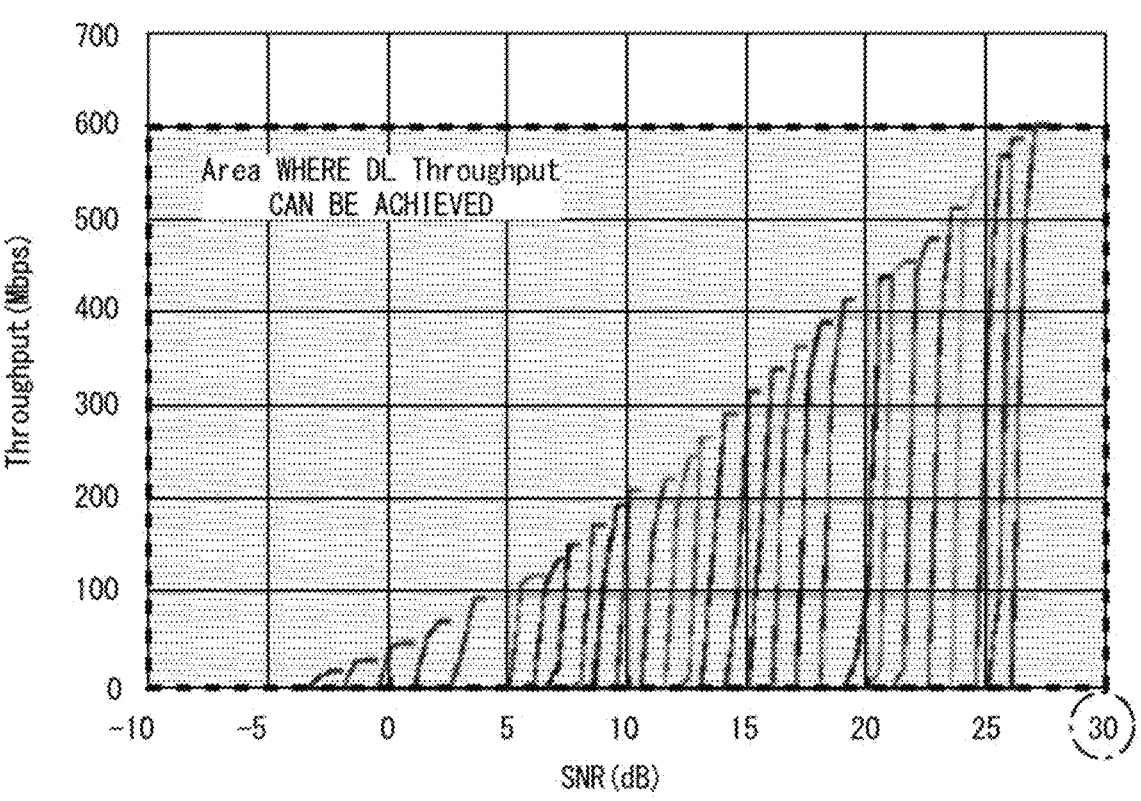
FIG. 32 is a diagram illustrating an example of a relationship between an SNR and a throughput, for each of a plurality of MCSs, in an AAS equipped with a transmission AMP that is a GaN AMP having a poor gate/drain lag with an AMP stabilization signal being applied to the transmission AMP according to an example embodiment.

FIG. 32 is a diagram illustrating an example of a relationship between an SNR and a throughput, for each of a plurality of MCSs, in the AAS 10 equipped with the transmission AMP 13 that is a GaN AMP having a poor gate/drain lag with an AMP stabilization signal being applied to the transmission AMP 13 according to the present example embodiment. In FIG. 32, the horizontal axis represents an SNR, and the vertical axis represents a throughput. Note that an example of a relationship between an SNR and a throughput, for each of a plurality of MCSs, in an AAS equipped with a transmission AMP having a poor gate/drain lag with no AMP stabilization signal being applied thereto is similar to that illustrated in FIG. 13.

Figure 13:
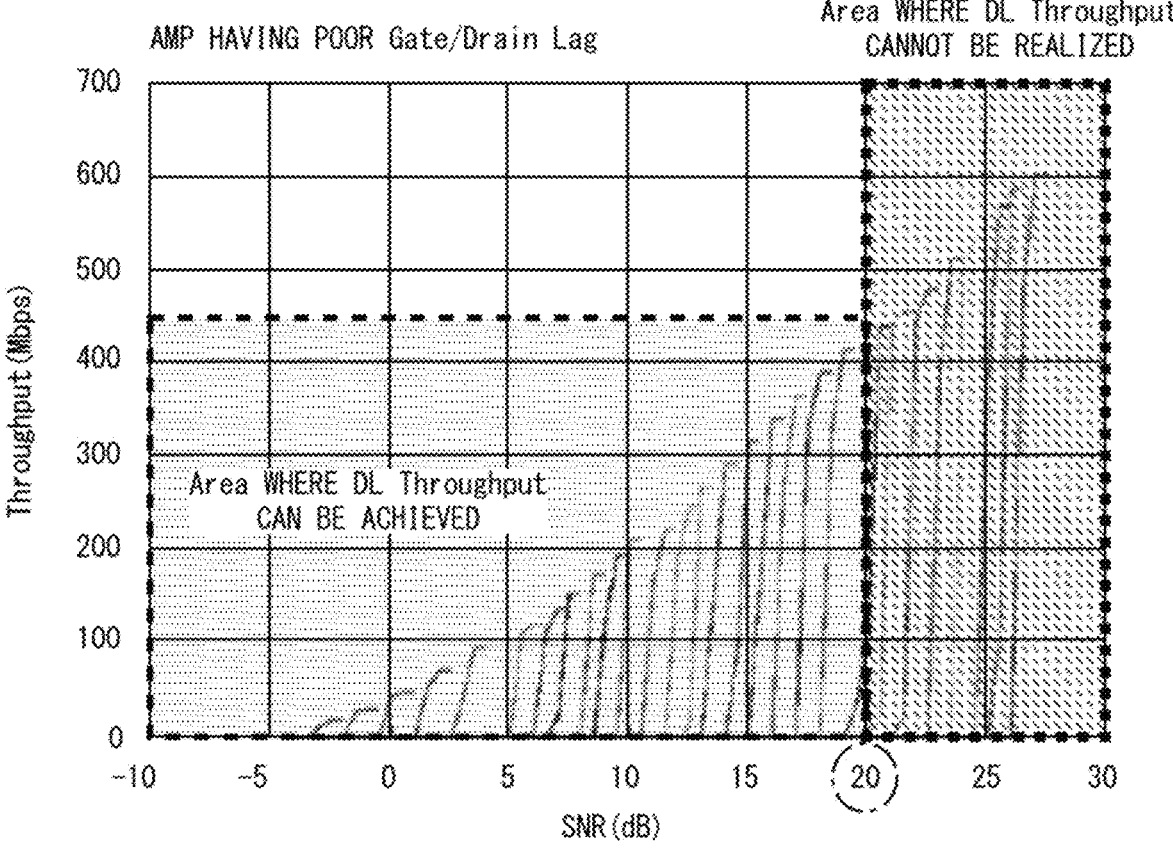
FIG. 13 is a diagram illustrating an example of a relationship between an SNR and a throughput, for each of a plurality of MCSs, in an AAS equipped with a transmission AMP that is a GaN AMP with a poor gate/drain lag.

As illustrated in FIG. 13, in a case where the AAS is equipped with a transmission AMP having a poor gate/drain lag with no AMP stabilization signal being applied thereto, a max throughput according to an SNR cannot be achieved particularly on a side toward the largest MCS (higher-order QAM). Therefore, an MCS with an SNR of about 20 dB or more cannot be operated. On the other hand, as illustrated in FIG. 32, in a case where the AAS 10 is equipped with the transmission AMP 13 that is a GaN AMP having a poor gate/drain lag with an AMP stabilization signal being applied to the transmission AMP 13 according to the present example embodiment, a max throughput according to an SNR can be achieved up to the maximum MCS.

The present disclosure has been described above with reference to the example embodiment, but the present disclosure is not limited to the example embodiment described above. Various modifications that can be understood by those skilled in the art can be made to the configurations and details of the present disclosure within the scope of the present disclosure.

For example, in the above-described example embodiment, an example in which the wireless communication apparatus according to the present disclosure is used for the AAS has been described, but the present disclosure is not limited thereto. The wireless communication apparatus according to the present disclosure can be used for any wireless communication apparatus (e.g., a wide area base station, a macro base station, or the like) having a transmission function of transmitting a transmission signal.

In addition, some functions of the wireless communication apparatus according to the present disclosure can be realized by causing a processor such as a central processing unit (CPU) to execute a program.

Figure 33:
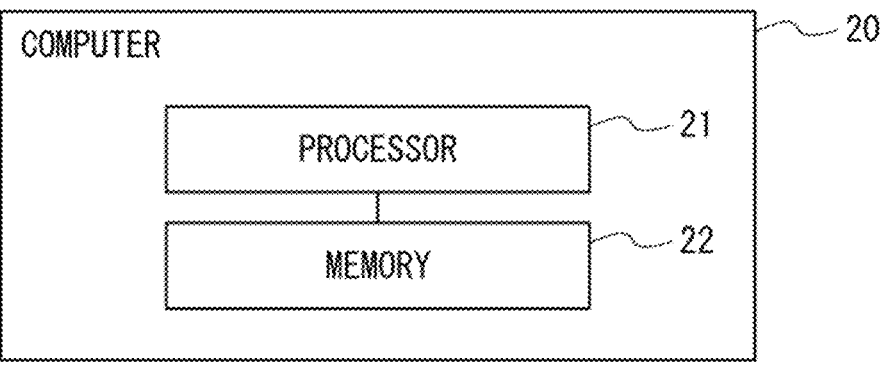
FIG. 33 is a diagram illustrating a hardware configuration example of a computer that realizes some functions of a wireless communication apparatus according to the present disclosure.

FIG. 33 is a diagram illustrating a hardware configuration example of a computer 20 that realizes some functions of the wireless communication apparatus according to the present disclosure.

As illustrated in FIG. 33, a computer 20 includes a processor 21 and a memory 22.

The processor 21 may be, for example, a microprocessor, a CPU, a micro processing unit (MPU), or the like. The processor 21 may include a plurality of processors.

The memory 22 is constituted by a combination of a volatile memory and a nonvolatile memory. The memory 22 may include a storage located away from the processor 21. In this case, the processor 21 may access the memory 22 through an input/output (I/O) interface (not illustrated).

A program is stored in the memory 22. This program includes a command group (or software codes) for causing the computer 20 to perform some functions of the AAS 10 according to the above-described example embodiment when read by the computer 20. The components in the AAS 10 described above may be realized by the processor 21 reading and executing a program stored in the memory 22. Furthermore, the components having the storage function in the AAS 10 described above may be realized by the memory 22.

Furthermore, the above-described program may be stored in a non-transitory computer-readable medium or a tangible storage medium. As an example and not by way of limitation, the computer-readable medium or the tangible storage medium includes a random-access memory (RAM), a read-only memory (ROM), a flash memory, a solid-state drive (SSD) or any other memory technology, a CD-ROM, a digital versatile disc (DVD), a Blu-ray (registered trademark) disc or any other optical disk storage, a magnetic cassette, a magnetic tape, a magnetic disk storage, or any other magnetic storage device. The program may be transmitted on a transitory computer-readable medium or a communication medium. As an example and not by way of limitation, the transitory computer-readable medium or the communication medium includes an electrical signal, an optical signal, an acoustic signal, or another form of propagation signal.

REFERENCE SIGNS LIST

10 AAS
11 SIGNAL PROCESSING UNIT
111 DETECTION UNIT
112 IFFT UNIT
113 SIGNAL STORAGE MEMORY
114 ADDER
12 TX
13 TRANSMISSION AMP
20 COMPUTER
21 PROCESSOR
22 MEMORY

What is claimed is:

1. A wireless communication apparatus comprising:
a processor;
a transmitter provided at a stage following the processor; and
a transmission amplifier provided at a stage following the transmitter,
wherein the processor is configured to:
detect whether there is a transmission signal; and
insert a stabilization signal for stabilizing characteristics of the transmission amplifier in a time domain preceding a time domain of the transmission signal when the transmission signal is detected, so that the stabilization signal passes through the transmitter and the transmission amplifier before the transmission signal passes through the transmitter and the transmission amplifier, wherein
when the wireless communication apparatus performs a time division duplex (TDD) operation, a time width of the stabilization signal is set within a time width of a period for switching the transmitter from a turn-off state to a turn-on state.

2. The wireless communication apparatus according to claim 1, wherein the processor includes:
a signal storage memory configured to store the stabilization signal;
an inverse fast Fourier transform (IFFT) circuit configured to convert the transmission signal from a signal in a frequency domain to a signal in a time domain;
a detector provided at a stage preceding the IFFT circuit, and configured to detect whether there is the transmission signal in the frequency domain; and
an adder configured to add the stabilization signal stored in the signal storage memory to the time domain preceding the time domain of the transmission signal output from the IFFT circuit when the transmission signal is detected by the detector.

3. The wireless communication apparatus according to claim 1, wherein the stabilization signal is a signal for stabilizing a gain, an output, and a nonlinear distortion characteristic of the transmission amplifier by generating a current collapse and a gain/drain lag in the transmission amplifier when input to the transmission amplifier.

4. A wireless communication apparatus comprising:
a processor;
a transmitter provided at a stage following the processor; and
a transmission amplifier provided at a stage following the transmitter,

wherein the processor is configured to:
detect whether there is a transmission signal; and
insert a stabilization signal for stabilizing characteristics of the transmission amplifier in a time domain preceding a time domain of the transmission signal when the transmission signal is detected, so that the stabilization signal passes through the transmitter and the transmission amplifier before the transmission signal passes through the transmitter and the transmission amplifier, wherein
a frequency bandwidth of the stabilization signal is set to a frequency bandwidth of a component carrier used to transmit the transmission signal.

5. The wireless communication apparatus according to claim 4, wherein the processor includes:
a signal storage memory configured to store the stabilization signal;
an inverse fast Fourier transform (IFFT) circuit configured to convert the transmission signal from a signal in a frequency domain to a signal in a time domain;
a detector provided at a stage preceding the IFFT circuit, and configured to detect whether there is the transmission signal in the frequency domain; and
an adder configured to add the stabilization signal stored in the signal storage memory to the time domain preceding the time domain of the transmission signal output from the IFFT circuit when the transmission signal is detected by the detector.

6. The wireless communication apparatus according to claim 4, wherein the stabilization signal is a signal for stabilizing a gain, an output, and a nonlinear distortion characteristic of the transmission amplifier by generating a current collapse and a gain/drain lag in the transmission amplifier when input to the transmission amplifier.

7. A wireless communication apparatus comprising:
a processor;
a transmitter provided at a stage following the processor; and
a transmission amplifier provided at a stage following the transmitter,
wherein the processor is configured to:
detect whether there is a transmission signal; and
insert a stabilization signal for stabilizing characteristics of the transmission amplifier in a time domain preceding a time domain of the transmission signal when the transmission signal is detected, so that the stabilization signal passes through the transmitter and the transmission amplifier before the transmission signal passes through the transmitter and the transmission amplifier, wherein
a power level of the stabilization signal is set to a power level at which an output of the transmission amplifier becomes a maximum rated root mean square (RMS) level and which is the same power level as that of the transmission signal.

8. The wireless communication apparatus according to claim 7, wherein the processor includes:
a signal storage memory configured to store the stabilization signal;
an inverse fast Fourier transform (IFFT) circuit configured to convert the transmission signal from a signal in a frequency domain to a signal in a time domain;
a detector provided at a stage preceding the IFFT circuit, and configured to detect whether there is the transmission signal in the frequency domain; and
an adder configured to add the stabilization signal stored in the signal storage memory to the time domain preceding the time domain of the transmission signal output from the IFFT circuit when the transmission signal is detected by the detector.

9. The wireless communication apparatus according to claim 7, wherein the stabilization signal is a signal for stabilizing a gain, an output, and a nonlinear distortion characteristic of the transmission amplifier by generating a current collapse and a gain/drain lag in the transmission amplifier when input to the transmission amplifier.

* * * * *